(12) United States Patent
Sheen

(10) Patent No.: US 6,191,666 B1
(45) Date of Patent: Feb. 20, 2001

(54) MINIATURIZED MULTI-LAYER CERAMIC LOWPASS FILTER

(75) Inventor: Jyh-Wen Sheen, Lotung (TW)

(73) Assignee: Industrial Technology Research Institute, Hsinchu (TW)

( * ) Notice: Under 35 U.S.C. 154(b), the term of this patent shall be extended for 0 days.

(21) Appl. No.: 09/275,945

(22) Filed: Mar. 25, 1999

(51) Int. Cl.$^7$ ....................................................... H03H 7/00
(52) U.S. Cl. ............................ 333/185; 333/202; 333/204
(58) Field of Search ..................................... 333/202–205, 333/185, 175

(56) References Cited

U.S. PATENT DOCUMENTS 5,357,227  10/1994  Tonegawa et al. ................... 333/185

OTHER PUBLICATIONS

D. Swanson, "Thin–Film Lumped–Element Microwave Filters," 1989 IEEE MTT–S Digest, pp. 671–674, 1989.
J. Helszajn, "Microwave Planar Passive Circuits and Filters," Chapter 15, John Wiley & Sons, 1994.
M. Miyazaky, et al., "A Broadband Dielectric Diplexer Using A Snaked Strip–Line," 1991 IEEE MTT–S Digest, pp. 551–554, 1991.
S. A. Maas, "Microwave Mixers," Artech House, pp. 244–255, 1993.

*Primary Examiner*—Benny Lee
*Assistant Examiner*—Kimberly E Glenn
(74) *Attorney, Agent, or Firm*—Stevens, Davis, Miller & Mosher, L.L.P.

(57) ABSTRACT

In a stripline configuration, a laminated lowpass filter circuit includes first through fifth dielectric substrates arranged in that order in a stack, first and second groundplane conductor layers disposed on the outer surfaces of the stack, and a shielding conductor layer formed on the third dielectric layer. First and second side electrodes are formed on sides of the stack. A stripline providing an inductive element is formed on the fourth dielectric layer, and first and second conductor plates providing capacitive elements are formed on the first and second dielectric layers. The terminal of the first conductor plate and a first end of the stripline are connected to the first side electrode. A terminal of the second conductor plate and a second end of the stripline are connected to the second side electrode. The first and second side electrodes constitute input and output terminals of the laminated lowpass filter circuit. The lowpass filter circuit can also be formed in a microstrip line configuration and a hybrid stripline and microstrip line configuration.

12 Claims, 18 Drawing Sheets

MINIATURIZED MULTI-LAYER CERAMIC LOWPASS FILTER

BACKGROUND OF THE INVENTION

1. Field of the Invention

This invention relates to multi-layer ceramic lowpass filters particularly for use in mobile communication instruments such as portable telephones and cordless telephones.

2. Description of Related Art

The following references provide background information relating to multi-layer ceramic lowpass and are hereby incorporated by reference in their entireties:

[1] D. Swanson, "Thin-Film Lumped-Element Microwave Filters," 1989 IEEE MTT-S Digest, pages 671–674, 1989.

[2] J. Helszajn, "Microwave Planar Passive Circuits and Filters," Chapter 15, John Wiley & Sons, 1994.

[3] M. Miyazaky, et al., "A Broad Band Dielectric Diplexer Using a Snake Strip-Line," 1991 IEEE MTT-S Digest, pages 551–554, 1991.

[4] U.S. Pat. No. 5,357,227 to Tinegawa, et al., 1994.

Depending on their implementation, filters can be grouped into three types: lumped-type, distributed-type and semi-lumped-type (which are constructed by lumped elements and distributed elements). The size of the distributed element, which is usually a section of transmission line, is determined by the signal wavelength associated with the operational frequencies. As a result, at frequencies lower than 200 MHz, the implementation of a filter by semi-lumped type or distributed-type elements is impractical due to the unacceptably large size of the distributed elements. However, in the higher microwave frequency region or millimeter wave frequency region, the distributed-type filters are always used due to acceptable size and better performance than the lumped-type filters. As discussed in reference [1], the reasons why the lumped elements are not suitable to be used in filter designs at frequencies higher than several hundred MHz are that the lumped inductors are too lossy and the parasitic effects make the control of filter performance more difficult. Although the problem of losses in lumped elements can be improved in superconductor applications, such applications are limited.

At frequencies between several hundred MHz to several Ghz, the size of the distributed elements is not appreciated in mobile communication instruments. The trends in developing mobile communication instruments are miniaturization and power saving. There are two ways to design a miniaturized filter with high performance; one is to employ a semi-lumped configuration and the other is to use a high dielectric constant structure. The semi-lumped type filters usually employ chip capacitors, inter-digital type capacitors or metal-insulation-metal (MIM) capacitors, which are not as lossy as lumped inductors, and some sections of distributed transmission lines, which are usually much shorter than ¼ signal wavelength. In addition to the capacity with regard to miniaturization of the semi-lumped configuration, this type of filter also has the ability to suppress periodic spurious signals from which the distributed type filters usually suffer. Recently, the high dielectric constant ceramic filters, such as coaxial type or mono-block type, are very popular in the frequency region of several hundred MHz to several Ghz due to high performance and small size. The high performance results from the shape of the cross-section of the transmission line which is usually round or smoothly curved, yielding lower conductor losses. The small size is enabled because the dielectric constant of ceramic materials is very high, resulting in a reduction in the signal wavelength. Yet, such kinds of filters are almost always used with regard to applications of bandpass filters or bandstop filters.

FIG. 1 is a perspective view of a conventional high frequency lowpass filter as described in reference [2]. In FIG. 1, the narrow microstrip transmission line sections 4a, 4b are used as equivalent series inductors. The wide transmission line sections 5a, 5b, 5c are used as equivalent capacitors connected to ground plane 3. More particularly, a first capacitive open-circuited stub electrode 5a forming a part of a first capacitor and an input electrode 6a forming an input terminal extend from the end of microstrip line electrode 4a. A second capacitive open-circuited stub electrode 5b forming part of a second capacitor extends from the other end of microstrip line electrode 4a and one end of the other end of the other microstrip line electrode 4b. A third capacitive open-circuited stub electrode 5c forming part of a third capacitor and an output electrode 6b as an output terminal extend from the other microstrip line electrode 4b. The equivalent circuit is as shown in FIG. 2.

The drawbacks of this filter are as follows. The filter order is high in general applications resulting from the attenuation poles of the filter all being located at infinite frequency. This in turn results in a larger circuit size. The filter order is defined from the numbers of the branches in the equivalent circuit. One branch is defined as an inductor, a capacitor, a series-connected capacitor and inductor or a shunt-connected capacitor and inductor. Since the branches in FIG. 2 are only single-capacitor or single-inductor, these branches contribute attenuation poles at infinite frequency. The attenuation pole means that all of the signal can not pass the filter. A series inductor is equivalent to an open circuit to infinite frequency ($j\omega L \to \infty$, if $\omega \to \infty$). A capacitor connected to ground is equivalent to a short circuit at infinite frequency ($1/j\omega C \to 0$, if $\omega \to \infty$). When a signal meets an open circuit or a short circuit, the total signal will be reflected back to the feed and no pass occurs. The number of attenuation poles at infinite frequency determine the slope of the rejection curve at the stopband. The larger the number is, the sharper the slope will be. Additionally, if the filter in FIG. 1 is used in the RF band, the capacitors in FIG. 2 usually have large values. This results in the areas occupied by the wide line sections 5a, 5b, 5c in FIG. 1 being necessarily large, since in general the substrate thickness can not be too thin due to requirements for the supporting strength of the total circuit. Therefore, this kind of filter is too large in size for low frequency applications. Also, if the lengths of the wide line sections 5a, 5b, 5c in FIG. 1 are decreased with the capacitor values being kept unchanged, then the widths of the wide line sections 5a, 5b, 5c must become even greater. This tradeoff means that it is quite difficult for this type of filter to be miniaturized. Further, because the size of the wide line sections 5a, 5b, 5c in FIG. 1 is too large, these pads (the wide line sections 5a, 5b, 5c) are not much smaller than the wavelength, and the resonance phenomena will occur in the higher frequency range. This results in spurious response in the higher frequency range and degradation of the stopband performance.

FIG. 3 shows another example from reference [2]. The equivalent circuit of this filter is shown in FIG. 4. In FIG. 3, narrow microstrip lines 34a, 34b are used as equivalent series inductors. Wide transmission line sections 35a, 35b, 35c are used as equivalent capacitors connected to ground plane 3. Narrow microstrip lines 34c, 34d, 34e are used as equivalent inductors in series with equivalent capacitors 35a, 35b, 35c, respectively. Input electrode 36a functions as an input terminal, and output electrode 36b functions as an output terminal. Comparing the equivalent circuit of FIG. 2 with that of FIG. 4, the only difference is the capacitor branch is changed into a series-connected capacitor and inductor. The branch formed of the series-connected capacitor and inductor elements can contribute an attenuation pole at the resonant frequency of these elements. This branch is equivalent to a short circuit to ground at resonant frequency. This indicates that this type of filter can improve the high filter order problem incurred by the FIG. 2 device. However, although the FIG. 3 filter can improve the high order problem, the element size is still too large. Therefore, the higher frequency performance is still poor.

FIG. 5 shows a snake-type lowpass filter described in reference [3]. Its equivalent circuit is shown in FIG. 6. In FIG. 5, narrow microstrip lines 54a–54g are used as equivalent inductors. Wide transmission line sections 55a–55d are located side-by-side and are used as equivalent capacitors connected to ground plane 3. The side-by-side equivalent capacitors 55a–55d produce capacitances between adjacent equivalent capacitors which are in parallel with equivalent inductors 54b–54f. Input electrode 56a functions as an input terminal, and output electrode 56b functions as an output terminal. In this circuit, there are some branches formed of shunt-connected capacitor and inductor pairs. These branches also contribute attenuation poles at their resonant frequencies and are equivalent to an open circuit at their resonant frequencies. Although this type of filter can have attenuation poles at a finite frequency, the attenuation poles cannot be located at the neighboring region of the passband since the capacitor in the shunt capacitor and inductor pair is too small (they are side-coupled as shown in FIG. 5). Therefore, in the FIG. 5 device, the capacity to reduce the filter order is limited.

SUMMARY OF THE INVENTION

It is an object of the present invention to provide a lowpass filter with a very wide rejection bandwidth thus yielding good spurious characteristics.

It is another object of the present invention to provide a miniaturized lowpass filter suitable for RF applications.

The invention provides a small-sized lowpass filter with very wide stopband suitable for implementation in a multi-layer ceramic (MLC) structure. The filter is a semi-lumped type filter, which is formed by lumped capacitors and distributed transmission lines. Small sections of transmission lines are used as equivalent inductors. The lumped capacitors can be formed in a metal-insulation-metal (MIM) configuration. Therefore, when the thickness between two metal plates is thin, the capacitors can have large values, but small sizes. Since in MLC structures, the capacitors can have large values, the lowpass filter can have finite attenuation poles very close to the passband edge. Thus, the filter order can be lower, and the filter size can be reduced. Also, since the capacitors are MIM-type, the sizes of the capacitors are very small. As a result, the capacitors can be treated as ideal lumped-type elements at higher operational frequencies, and the stopband of the lowpass filter can be extended to a higher frequency range.

The lumped equivalent circuit of this invention is shown in FIG. 7. The present inventive lowpass filter is semi-lumped type. Small sections of transmission lines are used as the inductors shown in FIG. 7. The distributed transmission lines are formed in a zigzag or spiral configuration on the same dielectric layer or different dielectric layers for miniaturization. The π-type capacitor network On–n, n–n+1, On+1–n+1(n=1,2,3 . . . ) is realized in the multi-layer ceramic structure. These capacitors are used as ideal lumped capacitors. The realization of the π-type capacitor network in MLC structure can overcome the drawbacks of the prior art. First, the thickness of the dielectric layer can be very thin, therefore, the capacitors can have larger values but very small size. Also, employing the multi-layer arrangements, the size of the circuit can be reduced further. Additionally, the shunt capacitors connected with the inductors can have large values; therefore the finite attenuation poles can be moved very close to the passband edge resulting in reduction of the filter order. Second, since the sizes of the capacitors can be very small, the resonance phenomena resulting from the too large physical size can be moved to the higher frequency region. This means that the spurious response is improved.

According to a first embodiment of the invention, there is provided a laminated lowpass filter circuit comprising a first dielectric substrate layer having substantially planar opposing surfaces; a first groundplane conductor layer disposed on a first one of the opposing surfaces; a first conductor plate comprising a capacitive element disposed on a second one of the opposing surfaces and having a terminal; a second dielectric substrate layer having substantially planar opposing surfaces with a first one of the opposing surfaces of the second dielectric substrate layer being disposed over the first conductor plate; a second conductor plate comprising a capacitive element disposed on a second one of the opposing surfaces of the second dielectric substrate layer and having a terminal; a third dielectric substrate layer having substantially planar opposing surfaces, with a first one of the opposing surfaces of the third dielectric substrate layer being disposed over the second conductor plate; a shielding conductor layer disposed over a second one of the opposing surfaces of the third dielectric substrate layer; a fourth dielectric substrate layer having substantially planar opposing surfaces, with a first one of the opposing surfaces of the fourth dielectric substrate layer being disposed over the shielding conductor layer; a stripline comprising an inductive element disposed on a second one of the opposing surfaces of the fourth dielectric substrate layer and having a first end and a second end; a fifth dielectric substrate layer having substantially planar opposing surfaces, with a first one of the opposing surfaces of the fifth dielectric substrate layer being disposed over the stripline; a second groundplane conductor layer disposed over a second one of the opposing surfaces of the fifth dielectric substrate layer, the first through fifth dielectric substrates, the first and second groundplane conductor layers and the shielding conductor layer being arranged in a stack; and a first side electrode formed on a first side of the stack and a second side electrode formed on a second side of the stack, the terminal of the first conductor plate and the first end of the stripline being connected to the first side electrode, and the terminal of the second conductor plate and the second end of the stripline being connected to the second side electrode, and the first and second side electrodes constituting input and output terminals of the laminated lowpass filter circuit.

According to a second embodiment of the invention, there is provided a laminated lowpass filter circuit comprising a first dielectric substrate layer having substantially planar opposing surfaces; a first groundplane conductor layer disposed on a first one of the opposing surfaces; a first stripline comprising an inductive element disposed on a second one of the opposing surfaces of the first dielectric substrate layer and having a first end and a second end; a second dielectric substrate layer having substantially planar opposing surfaces with a first one of the opposing surfaces of the second dielectric substrate layer being disposed over the first stripline; a first shielding conductor layer disposed over a second one of the opposing surfaces of the second dielectric substrate layer; a third dielectric substrate layer having substantially planar opposing surfaces with a first one of the opposing surfaces of the third dielectric substrate layer being disposed over the first shielding conductor layer; a first conductor plate comprising a capacitive element disposed on a second one of the opposing surfaces of the third dielectric layer and having a terminal; a fourth dielectric substrate layer having substantially planar opposing surfaces with a first one of the opposing surfaces of the fourth dielectric substrate layer being disposed over the first conductor plate; a second conductor plate comprising a capacitive element disposed on a second one of the opposing surfaces of the fourth dielectric substrate layer and having a terminal; a fifth dielectric substrate layer having substantially planar opposing surfaces, with a first one of the opposing surfaces of the fifth dielectric substrate layer being disposed over the second conductor plate; a third conductor plate comprising a capacitive element disposed on a second one of the opposing surfaces of the fifth dielectric substrate layer and having a terminal; a sixth dielectric substrate layer having substantially planar opposing surfaces, with a first one of the opposing surfaces of the sixth dielectric substrate layer being disposed over the third conductor layer; a second shielding conductor layer disposed over a second one of the opposing surfaces of the sixth dielectric substrate layer; a seventh dielectric substrate layer having substantially planar opposing surfaces, with a first one of the opposing surfaces of the seventh dielectric substrate layer being disposed over the shielding conductor layer; a second stripline comprising an inductive element disposed on a second one of the opposing surfaces of the seventh dielectric substrate layer and having a first end and a second end; an eighth dielectric substrate layer having substantially planar opposing surfaces, with a first one of the opposing surfaces of the eighth dielectric substrate layer being disposed over the second stripline; a second groundplane conductor layer disposed over a second one of the opposing surfaces of the eighth dielectric substrate layer, the first through eighth dielectric substrates, the first and second groundplane conductor layers and the first and second shielding conductor layers being arranged in a stack; and a first side electrode formed on a first side of the stack, a second side electrode formed on a second side of the stack, and a third side electrode formed on a third side of the stack, the terminal of the second conductor plate and the first end of the second stripline being connected to the first side electrode, the second terminal of the first stripline and the terminal of the third conductor layer being connected to the second side electrode, the first terminal of the first stripline, the terminal of the second conductor plate, and the second end of the second stripline being connected to the third side electrode, and the first and second side electrodes constituting input and output terminals of the laminated lowpass filter circuit.

According to a third embodiment of the invention, there is provided a laminated lowpass filter circuit comprising a first dielectric substrate layer having substantially planar opposing surfaces; a first groundplane conductor layer disposed on a first one of the opposing surfaces; a first conductor plate comprising a capacitive element disposed on a second one of the opposing surfaces and having a terminal; a second dielectric substrate layer having substantially planar opposing surfaces with a first one of the opposing surfaces of the second dielectric substrate layer being disposed over the first conductor plate; a second conductor plate comprising a capacitive element disposed on a second one of the opposing surfaces of the second dielectric substrate layer and having a terminal; a third dielectric substrate layer having substantially planar opposing surfaces, with a first one of the opposing surfaces of the third dielectric substrate layer being disposed over the second conductor plate; a third conductor plate comprising a capacitive element disposed on a second one of the opposing surfaces of the third dielectric substrate layer and having a terminal; a fourth dielectric substrate layer having substantially planar opposing surfaces, with a first one of the opposing surfaces of the fourth dielectric substrate layer being disposed over the third conductor plate; a shielding conductor layer disposed over a second one of the opposing surfaces of the fourth dielectric substrate layer; a fifth dielectric substrate layer having substantially planar opposing surfaces, with a first one of the opposing surfaces of the fifth dielectric substrate layer being disposed over the shielding conductor layer; a stripline comprising an inductive element disposed on a second one of the opposing surfaces of the fifth dielectric substrate layer and having a first end, a second end and a middle portion; a sixth dielectric substrate layer having substantially planar opposing surfaces, with a first one of the opposing surfaces of the sixth dielectric substrate layer being disposed over the stripline; a second groundplane conductor layer disposed over a second one of the opposing surfaces of the sixth dielectric substrate layer, the first through sixth dielectric substrates, the first and second groundplane conductor layers and the shielding conductor layer being arranged in a stack; and a first side electrode formed on a first side of the stack, a second side electrode formed on a second side of the stack, and a third side electrode formed on a third side of the stack, the terminal of the second conductor plate and the first end of the stripline being connected to the first side electrode, the terminal of the third conductor plate and the second end of the stripline being connected to the second side electrode, the terminal of the first conductor plate and the middle portion of the stripline being connected to the third side electrode, and the first and second side electrodes constituting input and output terminals of the laminated lowpass filter circuit.

According to a fourth embodiment of the invention, there is provided a laminated lowpass filter circuit comprising a first dielectric substrate layer having substantially planar opposing surfaces; a first groundplane conductor layer disposed on a first one of the opposing surfaces; a first conductor plate comprising a capacitive element disposed on a second one of the opposing surfaces and having first and second terminals; a second dielectric substrate layer having substantially planar opposing surfaces with a first one of the opposing surfaces of the second dielectric substrate layer being disposed over the first conductor plate; a second conductor plate comprising a capacitive element disposed on a second one of the opposing surfaces of the second dielectric substrate layer and having a terminal; a third dielectric substrate layer having substantially planar opposing surfaces, with a first one of the opposing surfaces of the third dielectric substrate layer being disposed over the second conductor plate; a third conductor plate comprising a capacitive element disposed on a second one of the opposing surfaces of the third dielectric substrate layer and having a terminal; a fourth dielectric substrate layer having substantially planar opposing surfaces, with a first one of the opposing surfaces of the fourth dielectric substrate layer being disposed over the third conductor plate; a shielding conductor layer disposed over a second one of the opposing surfaces of the fourth dielectric substrate layer; a fifth dielectric substrate layer having substantially planar opposing surfaces, with a first one of the opposing surfaces of the fifth dielectric substrate layer being disposed over the shielding conductor layer; a first stripline comprising an inductive element disposed on a second one of the opposing surfaces of the fifth dielectric substrate layer and having a first end and a second end; a second stripline comprising an inductive element disposed on the second one of the opposing surfaces of the fifth dielectric substrate layer and having a first end and a second end; a sixth dielectric substrate layer having substantially planar opposing surfaces, with a first one of the opposing surfaces of the sixth dielectric substrate layer being disposed over the first and second striplines; a second groundplane conductor layer disposed over a second one of the opposing surfaces of the sixth dielectric substrate layer, the first through sixth dielectric substrates, the first and second groundplane conductor layers and the shielding conductor layer being arranged in a stack; and a first side electrode formed on a first side of the stack, a second side electrode formed on a second side of the stack, a third side electrode formed on a third side of the stack, and a fourth side electrode formed on a fourth side of the stack, the terminal of the second conductor plate and the first end of the first stripline being connected to the first side electrode, the second terminal of the first groundplane conductor layer, the terminal of the third conductor plate and the second end of the second stripline being connected to the second side electrode, the first terminal of the first conductor plate and the second end of the first stripline being connected to the third side electrode, the second terminal of the first conductor plate and the first end of the second stripline being connected to the fourth side electrode, and the first and second side electrodes constituting input and output terminals of the laminated lowpass filter circuit.

According to a fifth embodiment of the invention, there is provided a laminated lowpass filter circuit comprising a first dielectric substrate layer having substantially planar opposing surfaces; a first groundplane conductor layer disposed on a first one of the opposing surfaces; a first conductor plate comprising a capacitive element disposed on a second one of the opposing surfaces and having first and second terminals; a second dielectric substrate layer having substantially planar opposing surfaces with a first one of the opposing surfaces of the second dielectric substrate layer being disposed over the first conductor plate; a second conductor plate comprising a capacitive element disposed on a second one of the opposing surfaces of the second dielectric substrate layer and having a terminal; a third conductor plate comprising a capacitive element disposed on the second one of the opposing surfaces of the second dielectric substrate layer and having a terminal; a third dielectric substrate layer having substantially planar opposing surfaces, with a first one of the opposing surfaces of the third dielectric substrate layer being disposed over the second and third conductor plates; a shielding conductor layer disposed over a second one of the opposing surfaces of the third dielectric substrate layer; a fourth dielectric substrate layer having substantially planar opposing surfaces, with a first one of the opposing surfaces of the fourth dielectric substrate layer being disposed over the shielding conductor layer; a first stripline comprising an inductive element disposed on a second one of the opposing surfaces of the fourth dielectric substrate layer and having a first end and a second end; a second stripline comprising an inductive element disposed on the second one of the opposing surfaces of the fourth dielectric substrate layer and having a first end and a second end; a fifth dielectric substrate layer having substantially planar opposing surfaces, with a first one of the opposing surfaces of the fifth dielectric substrate layer being disposed over the first and second striplines; a second groundplane conductor layer disposed over a second one of the opposing surfaces of the fifth dielectric substrate layer, the first through fifth dielectric substrates, the first and second groundplane conductor layers and the shielding conductor layer being arranged in a stack; and a first side electrode formed on a first side of the stack, a second side electrode formed on a second side of the stack, a third side electrode formed on a third side of the stack, and a fourth side electrode formed on a fourth side of the stack, the terminal of the second conductor plate and the first end of the first stripline being connected to the first side electrode, the terminal of the third conductor plate and the second end of the second stripline being connected to the second side electrode, the first terminal of the first conductor plate and the second end of the first stripline being connected to the third side electrode, the second terminal of the first conductor plate and a first end of the second stripline being connected to the fourth side electrode, and the first and second side electrodes constituting input and output terminals of the laminated lowpass filter circuit.

According to a sixth embodiment of the invention, there is provided a laminated lowpass filter circuit comprising a first dielectric substrate layer having substantially planar opposing surfaces; a first groundplane conductor layer disposed on a first one of the opposing surfaces; a first conductor plate comprising a capacitive element disposed on a second one of the opposing surfaces and having a terminal; a second dielectric substrate layer having substantially planar opposing surfaces with a first one of the opposing surfaces of the second dielectric substrate layer being disposed over the first conductor plate; a second conductor plate comprising a capacitive element disposed on a second one of the opposing surfaces of the second dielectric substrate layer and having first and second terminals; a third dielectric substrate layer having substantially planar opposing surfaces, with a first one of the opposing surfaces of the third dielectric substrate layer being disposed over the second conductor plate; a third conductor plate comprising a capacitive element disposed on a second one of the opposing surfaces of the third dielectric substrate layer and having a terminal; a fourth dielectric substrate layer having substantially planar opposing surfaces, with a first one of the opposing surfaces of the fourth dielectric substrate layer being disposed over the third conductor plate; a shielding conductor layer disposed over a second one of the opposing surfaces of the fourth dielectric substrate layer; a fifth dielectric substrate layer having substantially planar opposing surfaces, with a first one of the opposing surfaces of the fifth dielectric substrate layer being disposed over the shielding conductor layer; a first stripline comprising an inductive element disposed on a second one of the opposing surfaces of the fifth dielectric substrate layer and having a first end and a second end; a second stripline comprising an inductive element disposed on the second one of the opposing surfaces of the fifth dielectric substrate layer and having a first end and a second end; a sixth dielectric substrate layer having substantially planar opposing surfaces, with a first one of the opposing surfaces of the sixth dielectric substrate layer being disposed over the first and second striplines; a second groundplane conductor layer disposed over a second one of the opposing surfaces of the sixth dielectric substrate layer, the first through sixth dielectric substrates, the first and second groundplane conductor layers and the shielding conductor layer being arranged in a stack; and a first side electrode formed on a first side of the stack, a second side electrode formed on a second side of the stack, a third side electrode formed on a third side of the stack, and a fourth side electrode formed on a fourth side of the stack, the terminal of the third conductor plate and the first end of the first stripline being connected to the first side electrode, the terminal of the first conductor plate, the second terminal of the shielding conductor layer and the second end of the second stripline being connected to the second side electrode, the first terminal of the second conductor plate and the second end of the first stripline being connected to the third side electrode, the second terminal of the second conductor plate and the first end of the second stripline being connected to the fourth side electrode, and the first and second side electrodes constituting input and output terminals of the laminated lowpass filter circuit.

Any of the above embodiments may be incorporated in many diverse circuits such as a power amplifier used in a miniaturized RF module.

BRIEF DESCRIPTION OF THE DRAWINGS

FIGS. 11–18 illustrate configurations of the π-type capacitor networks of FIGS. 7 and 8;

FIGS. 11 and 12 illustrate microstrip line embodiments of the π-type capacitors networks;

FIGS. 13 and 14 illustrate stripline embodiments of the π-type capacitor networks;

FIGS. 15(a), 15(b), 16 and 17 illustrate a metal-insulation-metal (MIM) embodiments of the π-type capacitor networks;

FIGS. 16 and 17 illustrate different methods to equalize the potential of different conductor plates;

FIG. 18 illustrates an arrangement of the input and output directions of the configurations shown in FIGS 11–15;

FIG. 19 shows a microstrip line configuration;

FIG. 20 shows a stripline configuration;

FIG. 21 shows a multi-layer stripline configuration;

FIG. 22 shows a combined microstrip line and stripline configuration;

DETAILED DESCRIPTION OF THE INVENTION

Figure 8:
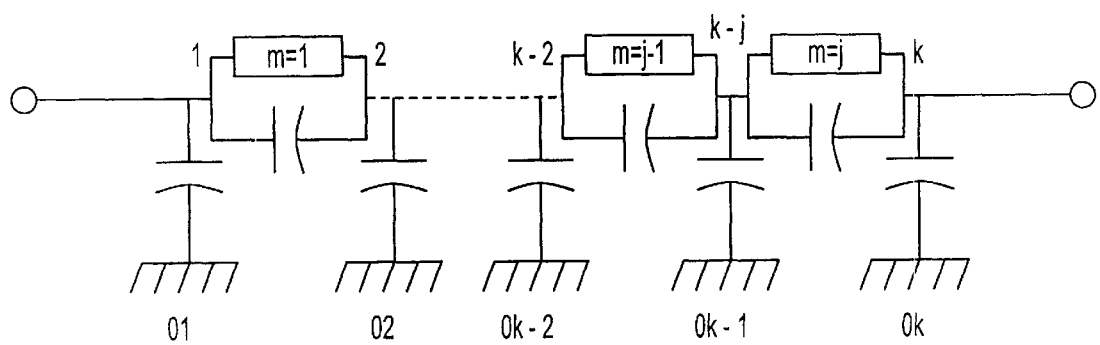
FIG. 8 is the equivalent circuit of the invention of FIG. 7.
Figure 9:
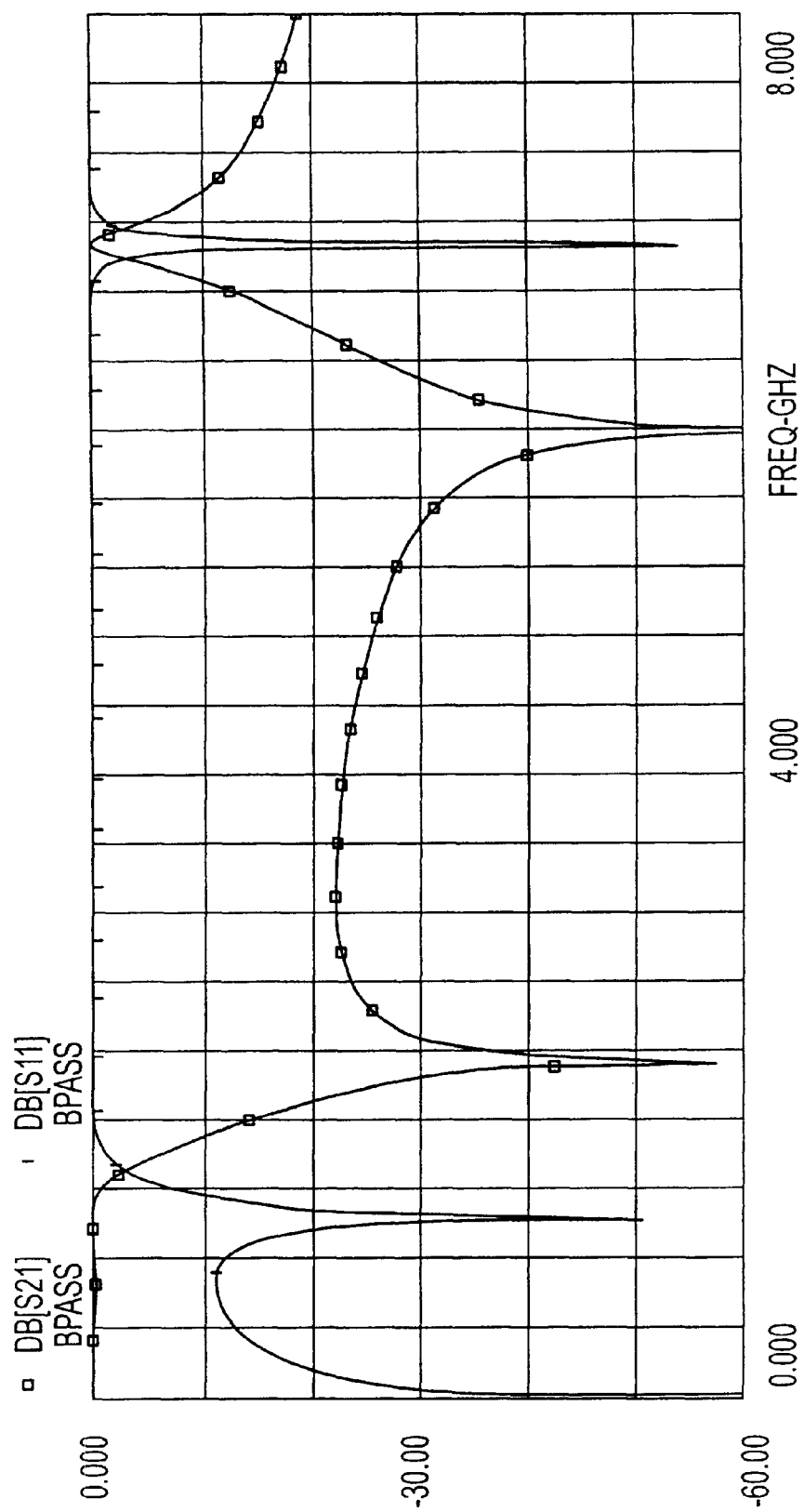
FIG. 9 illustrates the performance of the FIGS. 7 and 8 circuit where K=2 and j=1.
Figure 10:
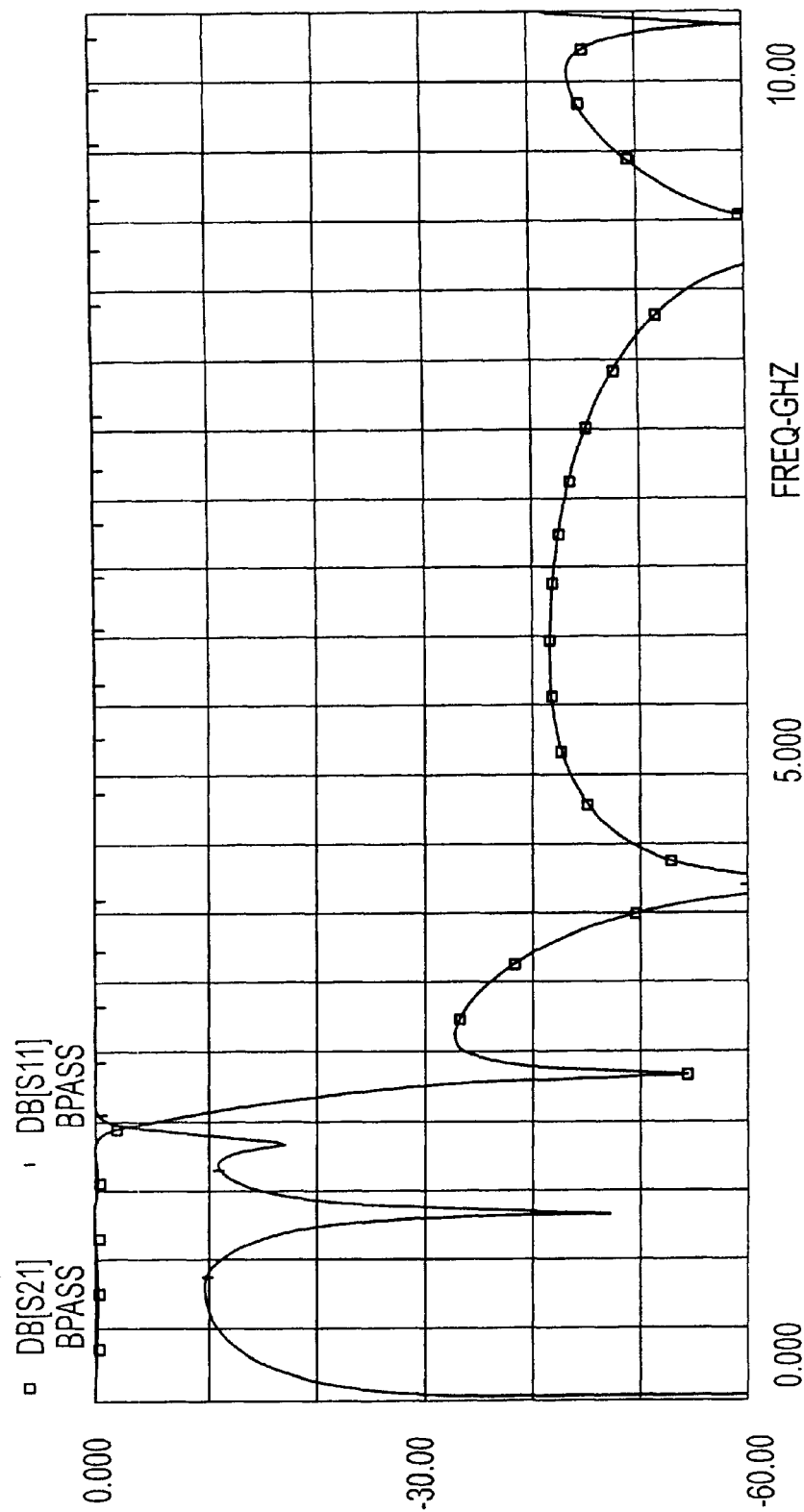
FIG. 10 illustrates the performance of the FIGS. 7 and 8 circuit where K=3 and j=2.

The equivalent circuit of the invention is shown in FIG. 8. The nodes On (n=1,2,3, . . . k) stand for grounding. The arms On–n, n–n+1(n=1,2,3 . . . k) represent the lumped capacitors. The strips m (m=1,2,3 . . . j) represent sections of transmission lines. In FIG. 8, it should be noted incidentally that j=k−1. The typical performance results of the invention are shown in FIG. 9 (k=2, j=1) and FIG. 10 (k=3, j=2).

Following are detailed descriptions of various physical embodiments of the equivalent circuit shown in FIG. 8. The equivalent circuit can be implemented by microstrip line circuitry, stripline circuitry or a hybrid microstrip line/stripline circuit in a multi-layer ceramic (MLC) structure. There are many realizations of the invention which would be apparent to those of ordinary skill in the art upon their reading of the disclosure of the present invention. In order to avoid too lengthy descriptions, only the embodiments of the circuit elements in the equivalent circuit shown in FIG. 8 are described herein.

At first, the realizations of the π-type capacitor networks will be described: On–n, n–n+1, On+1–n+1 (i.e., in FIGS. 7 and 8, the capacitors between nodes 01–1, 1–2, and 02–2).

Figure 11:
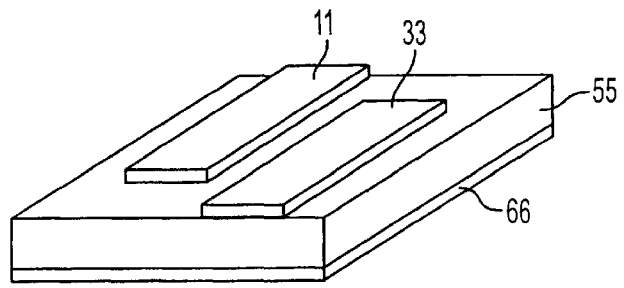
Figure 12:
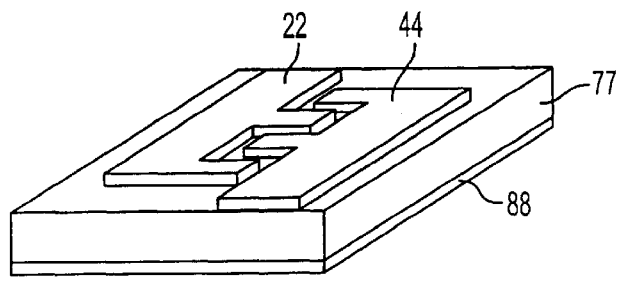

In microstrip circuitry, the realization of such π-type capacitor network is shown in FIG. 11. In FIG. 11, two coupled microstrip lines 11, 33 (i.e., between nodes 1 and 2 of FIG. 8) are placed on the dielectric substrate 55 with a ground plane 66. If the capacitor n–n+1 (i.e., between nodes 1 and 2 of FIG. 8) must have a large value, the realization is as shown as FIG. 12. In FIG. 12, two inter-digital conductor strips 22, 44 are placed on dielectric substrate 77 with ground plane 88. The inter-digital arrangement of conductor strips 22, 44 increases the capacitance value between nodes n–n+1 by increasing the coupling length between the two microstrip lines.

Figure 13:
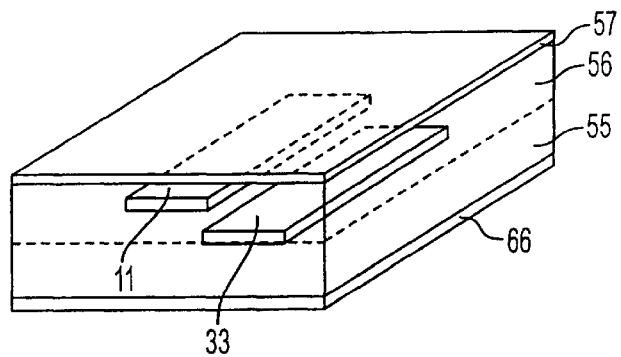
Figure 14:
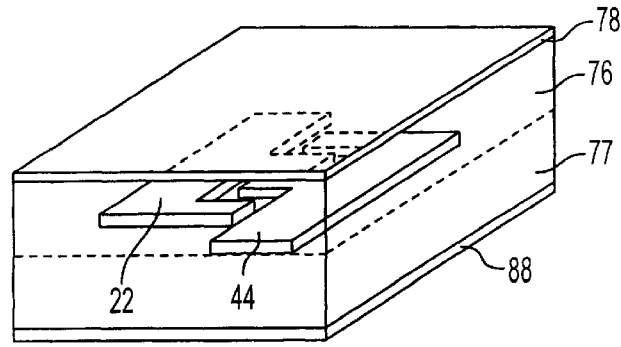

In stripline circuitry, the realizations of the π-type capacitor network are shown in FIG. 13 and FIG. 14. FIG. 13 differs from FIG. 11 only in that a dielectric substrate 56 and a top ground plane 57 are disposed over substrate 55. FIG. 14 differs from FIG. 12 only in that a dielectric substrate 76 and top ground plane 78 are disposed over substrate 77.

Figure 15A:
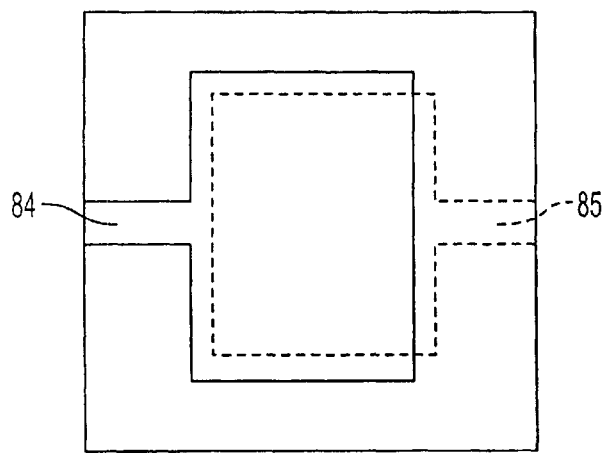
Figure 15B:
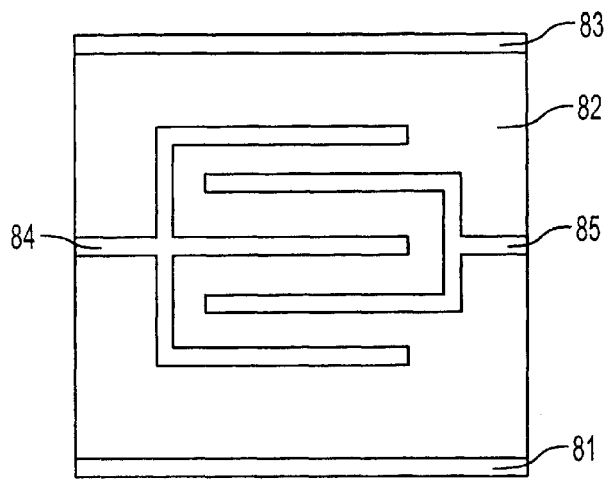

Further, in multi-layer structure, the metal-insulation-metal (MIM) π-type capacitor network can be implemented as shown in FIGS. 15(a) and 15(b). FIGS. 15(a) and 15(b) employ several conductor plates, which are grouped as elements 84, 85. These conductor plates are inserted in different layers of dielectric substrate 82 between ground planes 81, 83. In a multi-layer microstrip structure, the top ground plane 83 and the portion of the dielectric substrate 82 between the top conductor plate 84 and the top ground plane 83 are removed. The number of the conductor plates in the groups 84, 85 can be any desired number. The positions of the input point and the output point of plate groups 84, 85 can be located at any layer and in any direction.

Figure 16:
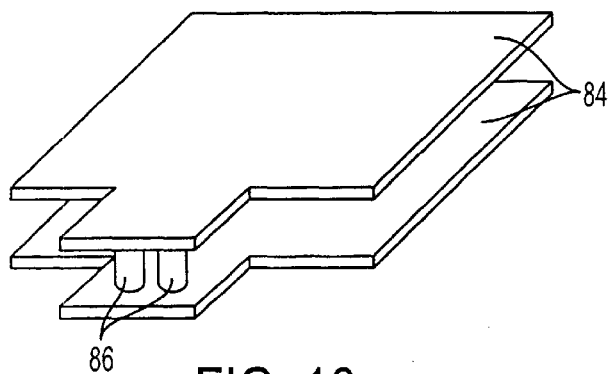

FIG. 16 shows a way to equalize the potential of the grouped conductor plates 84, 85, where via hole 86 is used to connect the conductor plates of a particular group. The number of via holes 86 can be any desired number.

Figure 17:
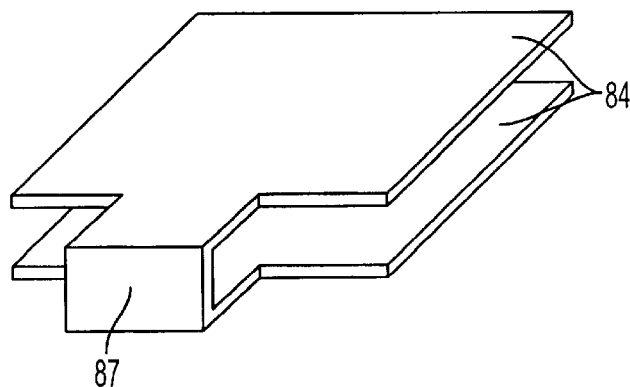

On the other hand, if the conductor plates are placed near the edge of the ceramic body, the connection of the conductor plates at different layers can be done via the side conductor electrode 87 as shown in FIG. 17.

Figure 18:
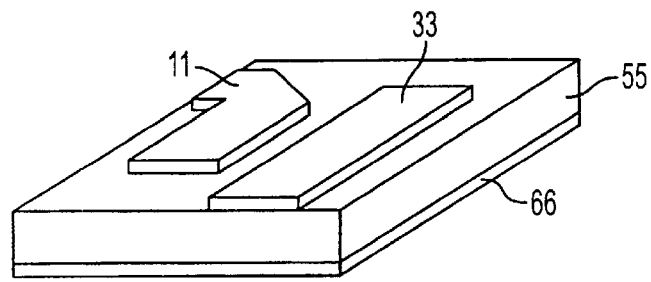

Additionally, the input direction and the output direction of the π-type capacitor networks in FIGS. 11 to 15 can be oriented in any desired direction e.g. as shown in FIG. 18. The conductor strips 11, 33 can be directed in different directions, depending on the filter layout.

Figure 1:
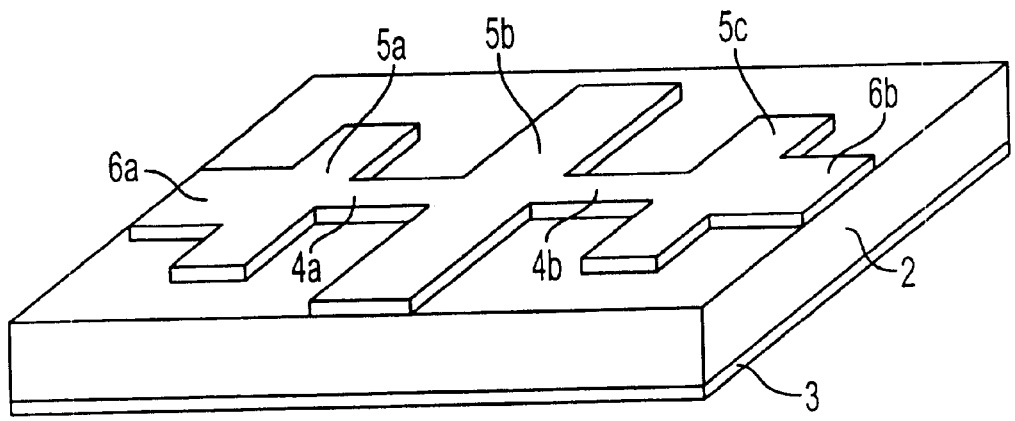
FIG. 1 is a perspective view of a conventional high frequency lowpass filter.
Figure 2:
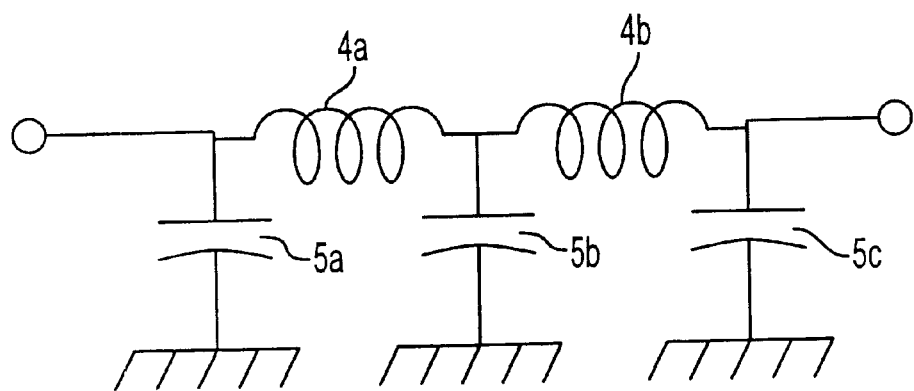
FIG. 2 is an equivalent circuit of the conventional filter of FIG. 1.
Figure 3:
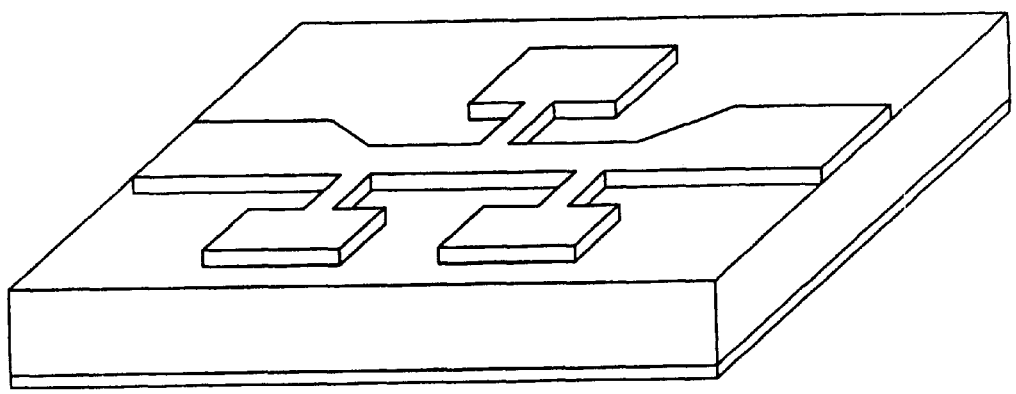
FIG. 3 is a perspective view of another example of a conventional high frequency lowpass filter.
Figure 4:
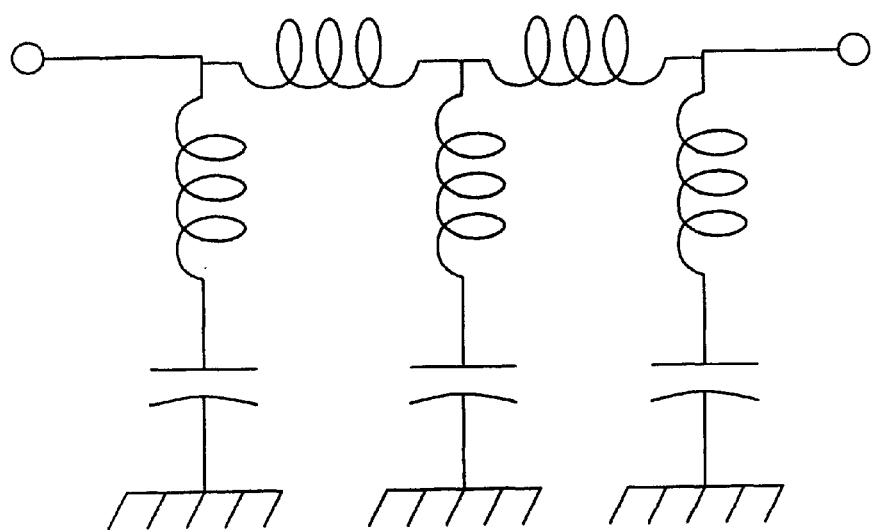
FIG. 4 is an equivalent circuit of the conventional filter of FIG. 3.
Figure 5:
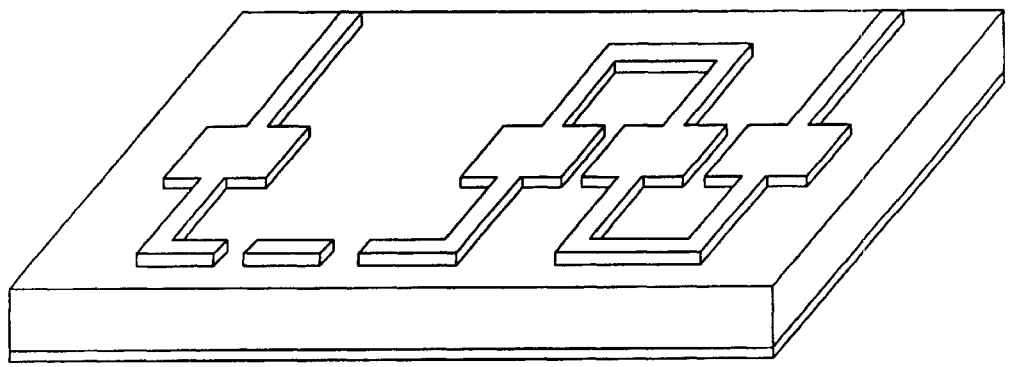
FIG. 5 is a perspective view of a snake-type low pass configuration of a prior art filter.
Figure 6:
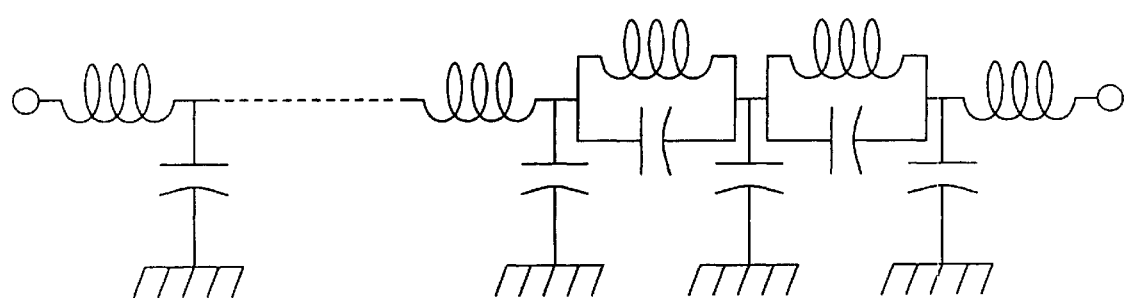
FIG. 6 is an equivalent circuit of the conventional filter of FIG. 5.
Figure 7:
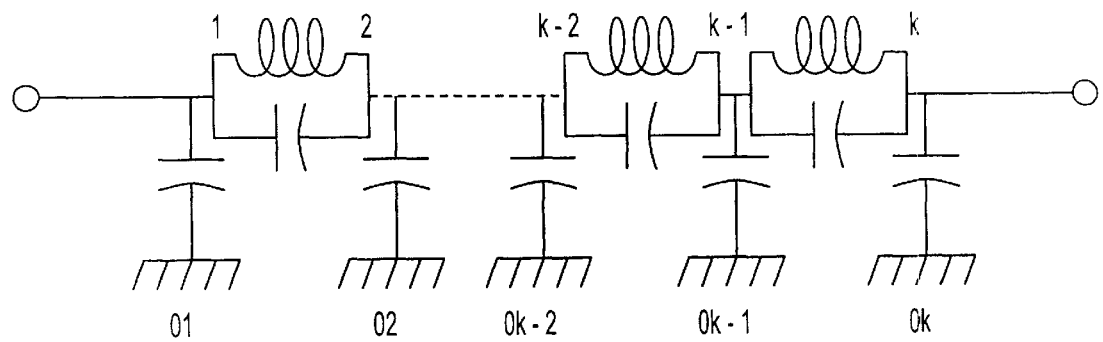
FIG. 7 is a lumped equivalent circuit of the present invention.
Figure 19:
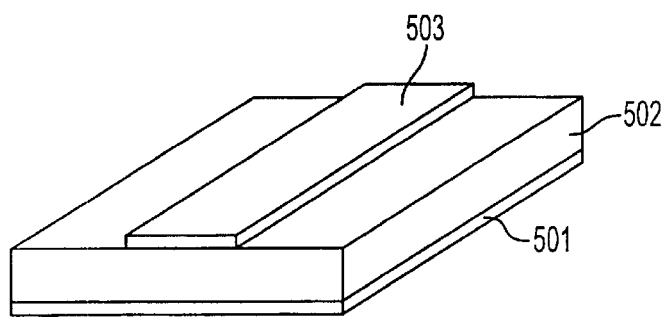
FIGS. 19–22 illustrate the configurations of the transmission line sections of FIGS. 7 and 8.
Figure 20:
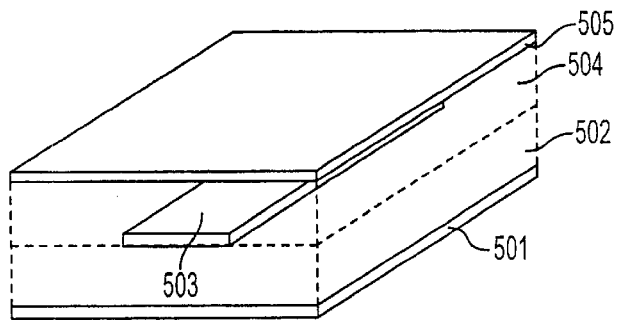
Figure 21:
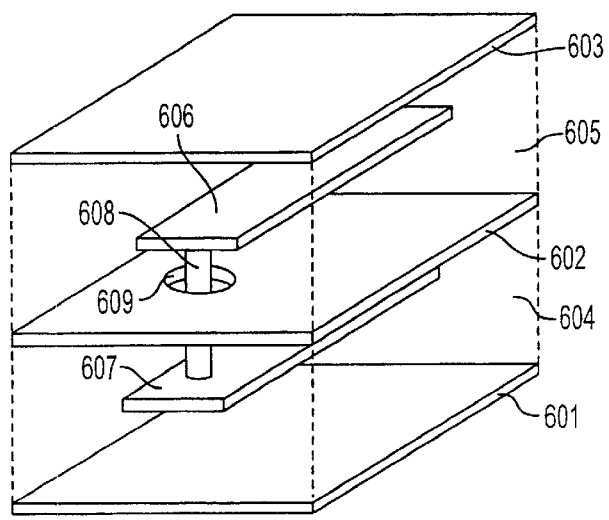
Figure 22:
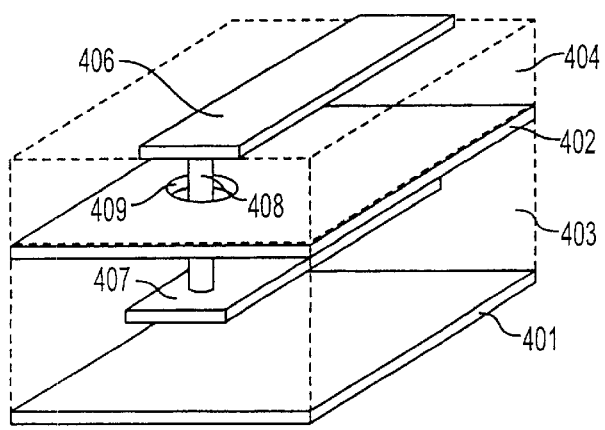

FIGS. 19 and 20 show embodiments of transmission line sections m (m=1,2,3 . . . j) of FIGS. 7 and 8. In FIG. 19, a conductor strip 503 is placed on a dielectric substrate 502 with a ground plane 501. This is a so-called microstrip line. In FIG. 20, a dielectric substrate 504 with a top ground plane 505 is placed on 502 in FIG. 19. This constitutes a so-called stripline. The conductor strip 503 can be formed in a zigzag or spiral configuration to minimize the size. Additionally, they can be implemented by a multi-layer strip line as shown in FIG. 21. In FIG. 21, two dielectric substrates 604, 605 are disposed between three grounds planes 601, 602, 603. The conductor strips 606, 607 are connected by via hole 608 passing through the no conductor area 609. Another realization of transmission line sections is shown in FIG. 22. In FIG. 22, 401, 402 are conductor planes, 403, 404 are dielectric substrate layers, 406 is a microstrip line and 407 is a stripline. The connection of microstrip line 406 and stripline 407 can be made by the via hole 408 passing through the no conductor area 409. Also, the connection between the transmission lines or the transmission line and the capacitor can be done by the technique shown in FIG. 17.

Figure 24:
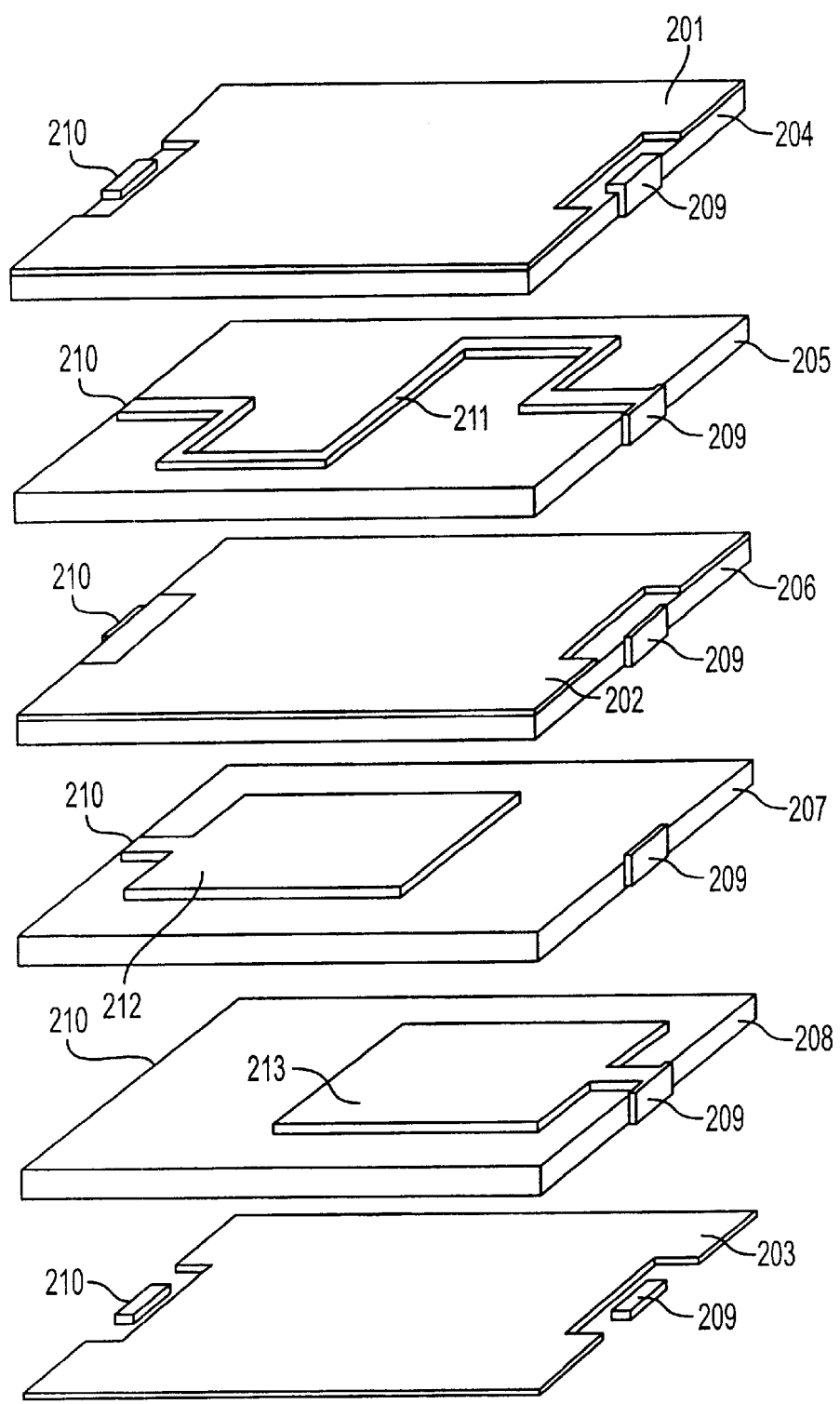
FIG. 24 shows an embodiment of the equivalent circuit of FIG. 8 where k=2 and j=1.
Figure 25:
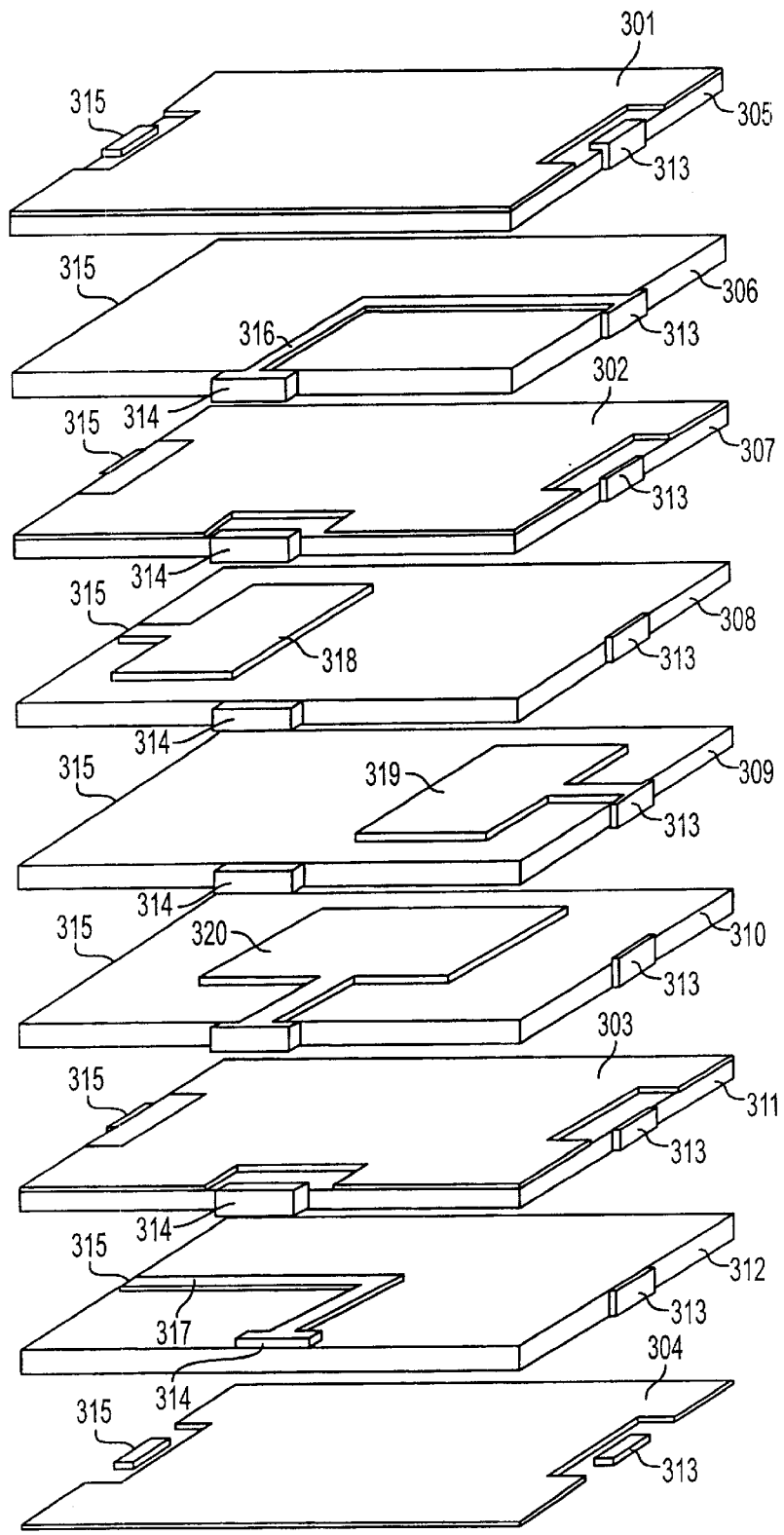
FIGS. 25–29 show various embodiments of the equivalent circuit of FIG. 8 where k=3 and j=2.

Two embodiments of the equivalent circuit shown in FIG. 8 are shown in FIG. 24 (k=2, j=1) and FIG. 25 (k=3, j=2).

Figure 23A:
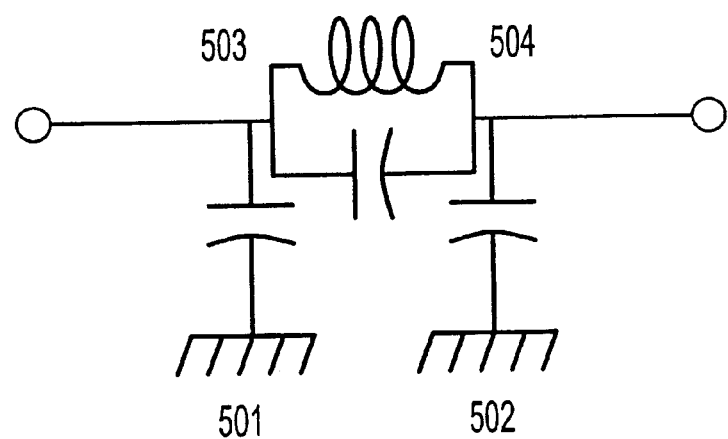
FIG. 23(a) shows a lumped equivalent circuit of the lowpass filter of FIG. 24.
Figure 23B:
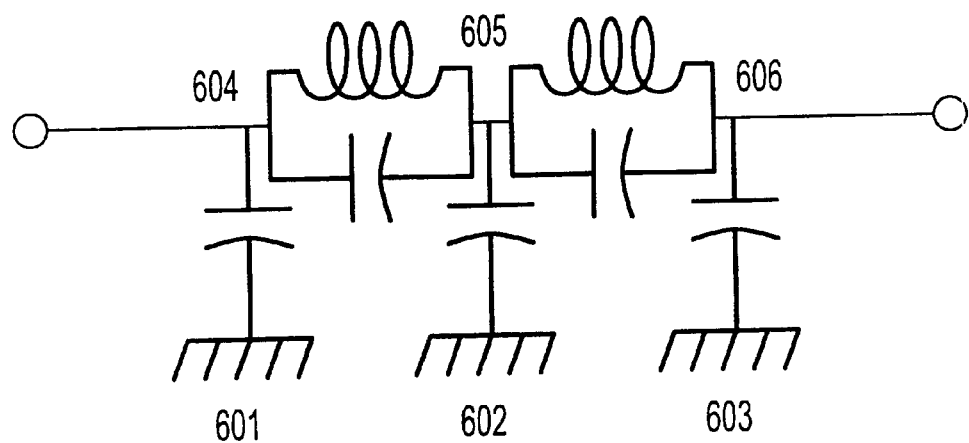
FIG. 23(b) shows a lumped equivalent circuit of the lowpass filters of FIGS. 25–29.

FIG. 23(*a*) shows the lumped equivalent circuit of the lowpass filter in FIG. 24. FIG. 23(*b*) shows the lumped equivalent circuit of the lowpass filters in FIGS. 25–29.

Following is an explanation of how the lowpass filter shown in FIG. 24 is the implementation of the circuit shown in FIG. 23(*a*). The π-type capacitor network in FIG. 23(*a*) can be implemented according to the techniques shown in FIGS. 11–15. In FIG. 24, the technique shown in FIGS. 15(*a*) and (*b*) is employed, but only two pieces of conductor plates 212, 213 are used. The inductor between 503 and 504 in FIG. 23(*a*) can be implemented by a section of transmission line. The transmission line section can be a stripline as shown in FIG. 20, a multi-layer stripline as shown in FIG. 21, a microstrip line as shown in FIG. 19, or a multi-layer microstrip line as shown in FIG. 22. In FIG. 24, a meandered stripline 211 (the same as that in FIG. 20) is employed as the equivalent inductor. The connections 503 and 504 between the inductor and the capacitors shown in FIG. 23(*a*) are achieved by the side electrodes 209, 210 shown in FIG. 24. The side electrodes are the same as described in FIG. 17. The side electrodes 209, 210 are also used as I/O pads. In FIG. 24, 201, 202, 203 are ground planes and 204, 205, 206, 207, 208 are dielectric substrates or ceramic bodies. The conductor plate 202 is not only used as a ground plane, but also a shielding layer to isolate the electromagnetic coupling between the transmission line section 211 and the capacitor network 212, 213.

Following is an explanation of the implementations of the circuit shown in FIG. 23(*b*) by the examples shown in FIGS. 25–29.

Figure 26:
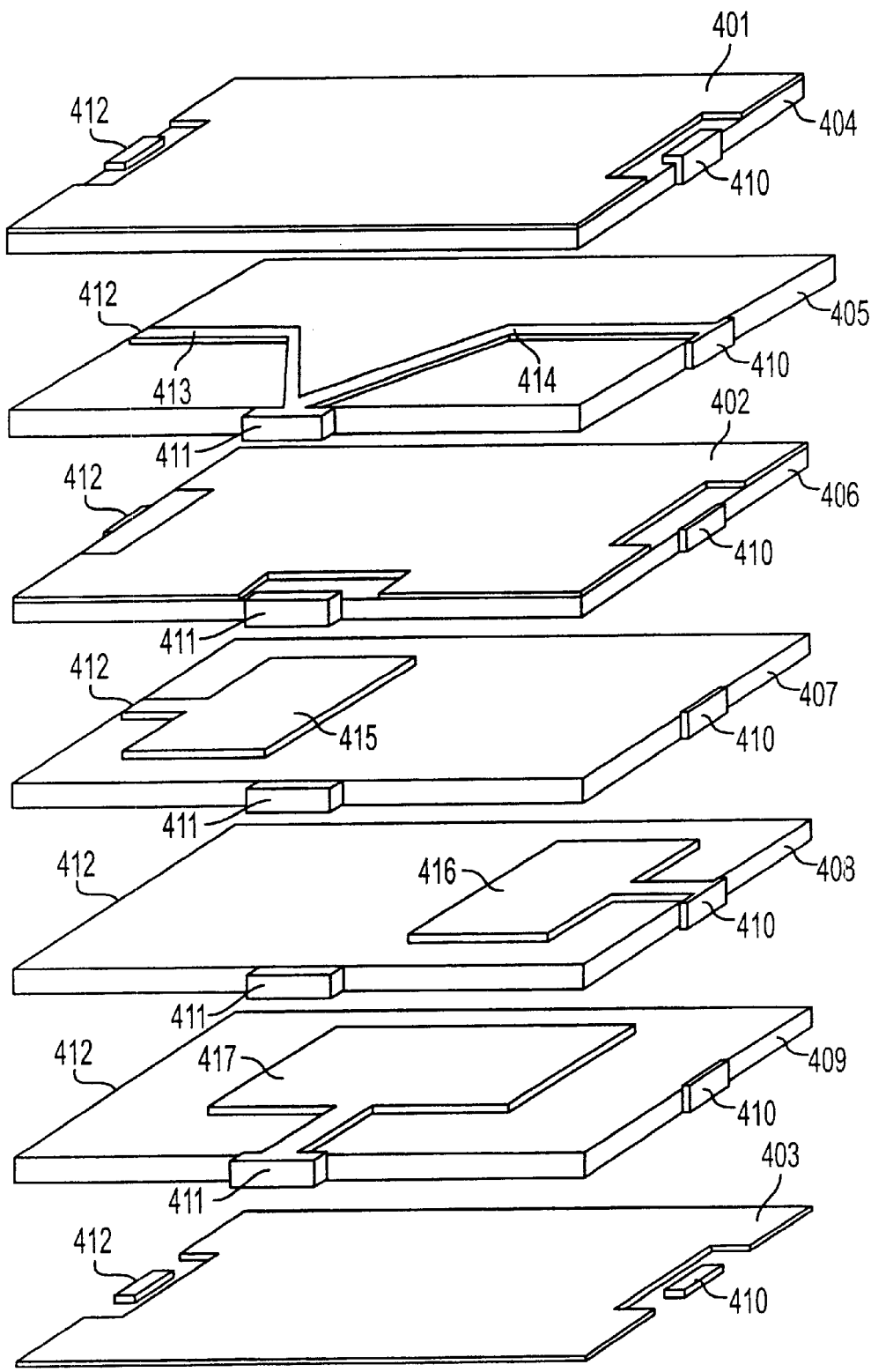

The π-type capacitor network between 601, 602, 604, 605 (shown in FIG. 23(*b*)) is implemented by the conductor plates 318, 320 in FIG. 25 (415, 417 in FIG. 26). The π-type capacitor network between 602, 603, 605, 606 is implemented by the conductor plates 320, 319 in FIG. 25 (417, 416 in FIG. 26). The inductor between 604 and 605 is implemented by a section of stripline 317 in FIG. 25 (414 in FIG. 26). The connections 604, 605 and 606 are achieved by side electrodes 313, 314, 315 in FIG. 25 (410, 411, 412 in FIG. 26). The side electrodes 313, 315 in FIG. 25 (410, 412 in FIG. 26) are also used as input/output (I/O) pads. 301, 302, 303, 304 in FIG. 25 (401, 402, 403 in FIG. 26) are ground planes. 302, 303, 402 function as shielding layers. 305–312 and 404–409 are the dielectric substrates or ceramic bodies.

In FIG. 25, stripline inductors 316, 317 are disposed on different substrate layers 306 and 312, while in FIG. 26, stripline inductors 413, 414 are disposed on the same substrate layer 405. Disposing the stripline inductors on different layers is advantageous in cases where the circuit area is limited and the stripline inductors are too long. Placing the stripline inductors at different layers can result in a more compact overall arrangement and also avoids coupling between the stripline inductors.

Figure 27:
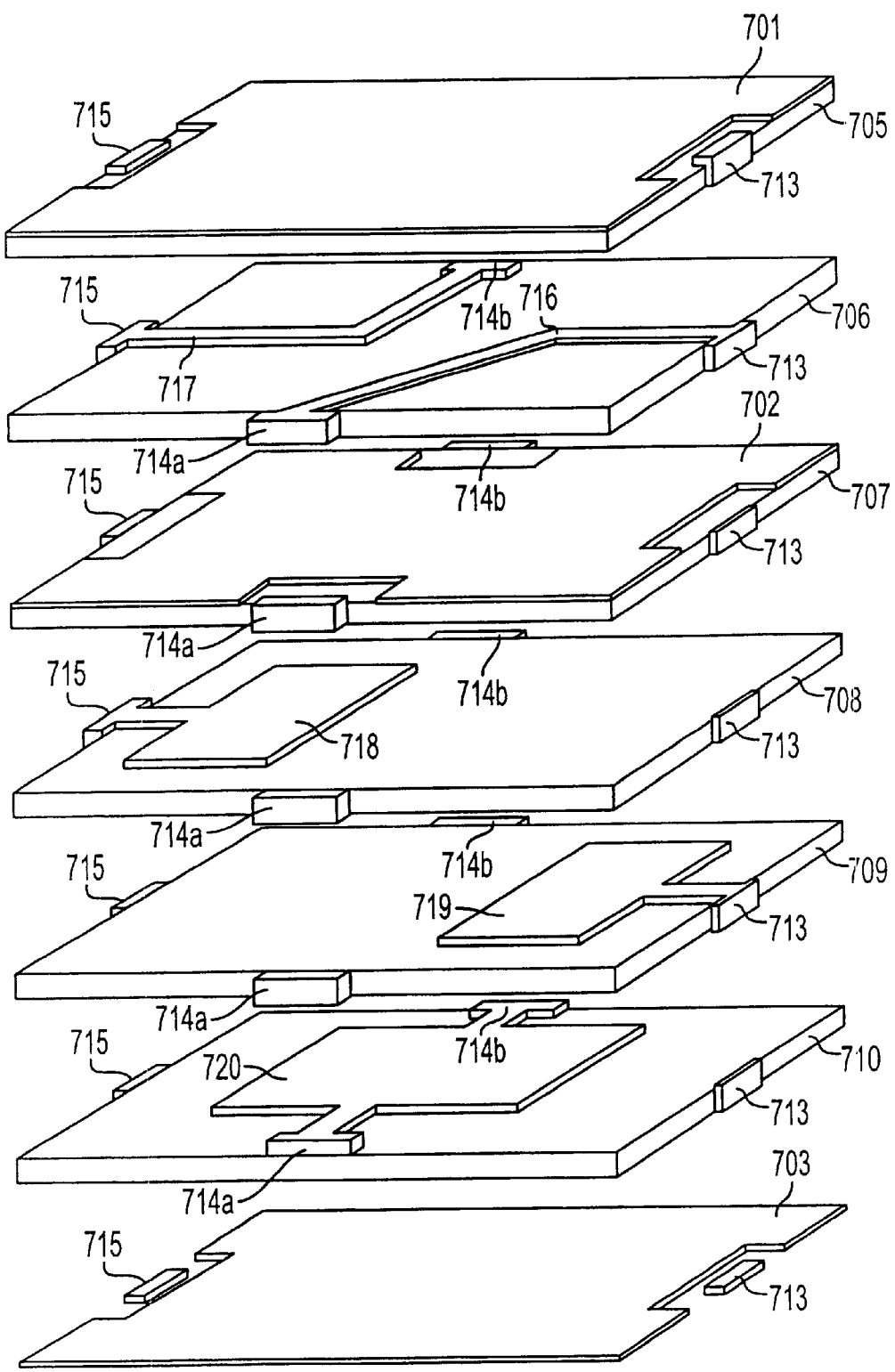

In FIG. 27, the π-type capacitor network between 601, 602, 604, 605 of FIG. 23(*b*) is implemented by conductor plates 718, 720. The π-type capacitor network between 602, 603, 605, 606 of FIG. 23(*b*) is implemented by conductor plates 720, 719. The inductor between 604 and 605 is implemented by a section of stripline 717. The inductor between 605 and 606 is implemented by stripline 716. The connections 604, 606 are achieved by side electrodes 713, 715. The side electrodes 713, 715 are also used as I/O pads. The implementation of connection 605 is achieved by side electrodes 714*a* and 714*b*, with 714*a* being used to connect stripline inductor 716 and 714*b* being used to connect stripline inductor 717. 701, 702, 703 are ground planes. 702 is used as a shielding layer. 705, 706, 707, 708, 709 and 710 are dielectric substrates or ceramic bodies.

Figure 28:
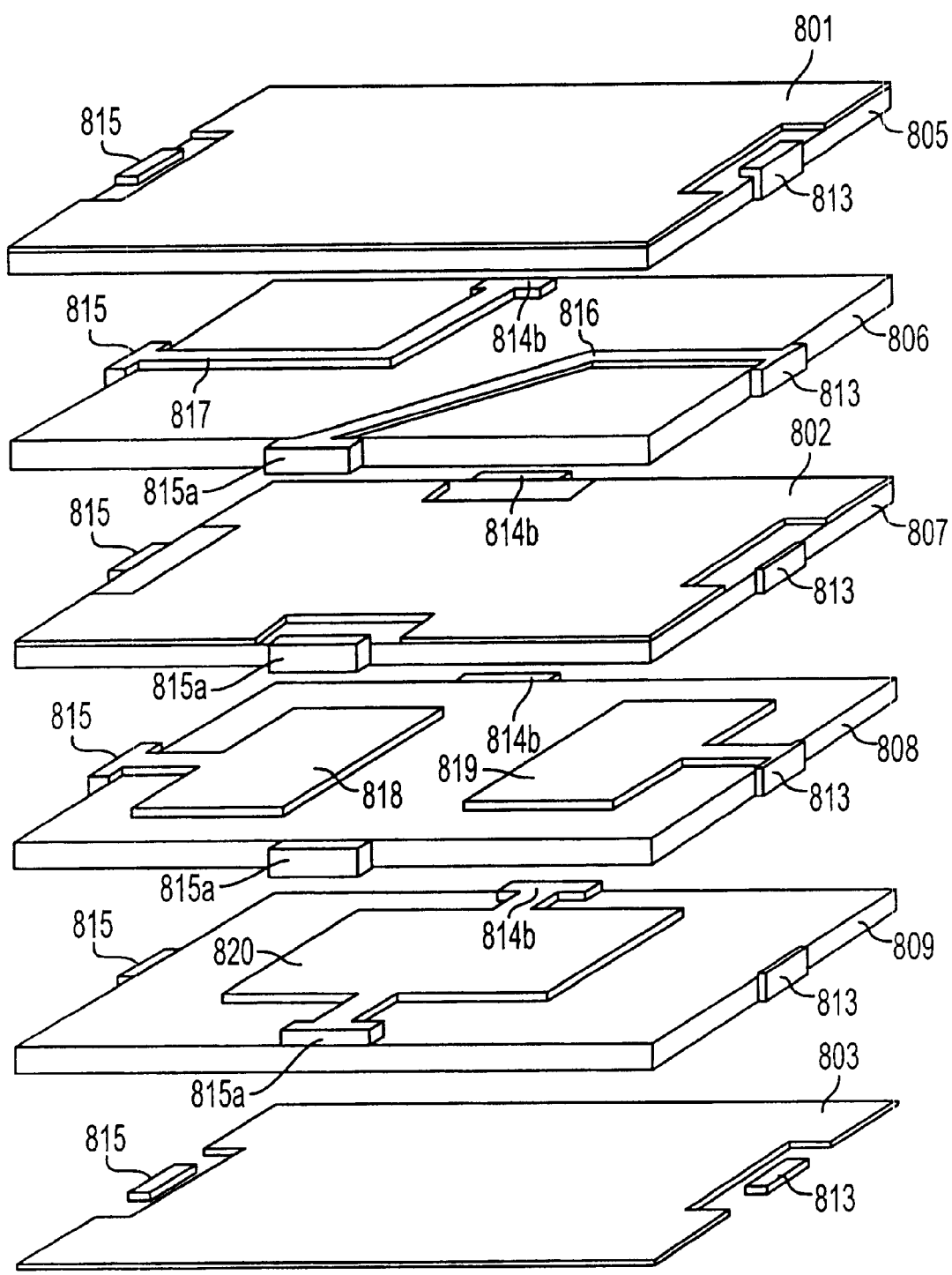

In FIG. 28, the π-type capacitor network between 601, 602, 604, 605 of FIG. 23(*b*) is implemented by conductor plates 818, 820. The π-type capacitor network between 602, 603, 605, 606 of FIG. 23(*b*) is implemented by conductor plates 820, 819. The inductor between 604 and 605 is implemented by a section of stripline 817. The inductor between 605 and 606 is implemented by stripline 816. The connections 604, 605, 606 are achieved by side electrodes 813, 814, 815. The side electrodes 813, 815 are also used as I/O pads. The implementation of connection 605 is achieved by side electrodes 814*a* and 814*b*, with 814*a* being used to connect stripline inductor 816 and 814*b* being used to connect stripline inductor 817. 801, 802, 803 are ground planes. 802 is used as a shielding layer. 805, 806, 807, 808 and 809 are dielectric substrates or ceramic bodies.

Figure 29:
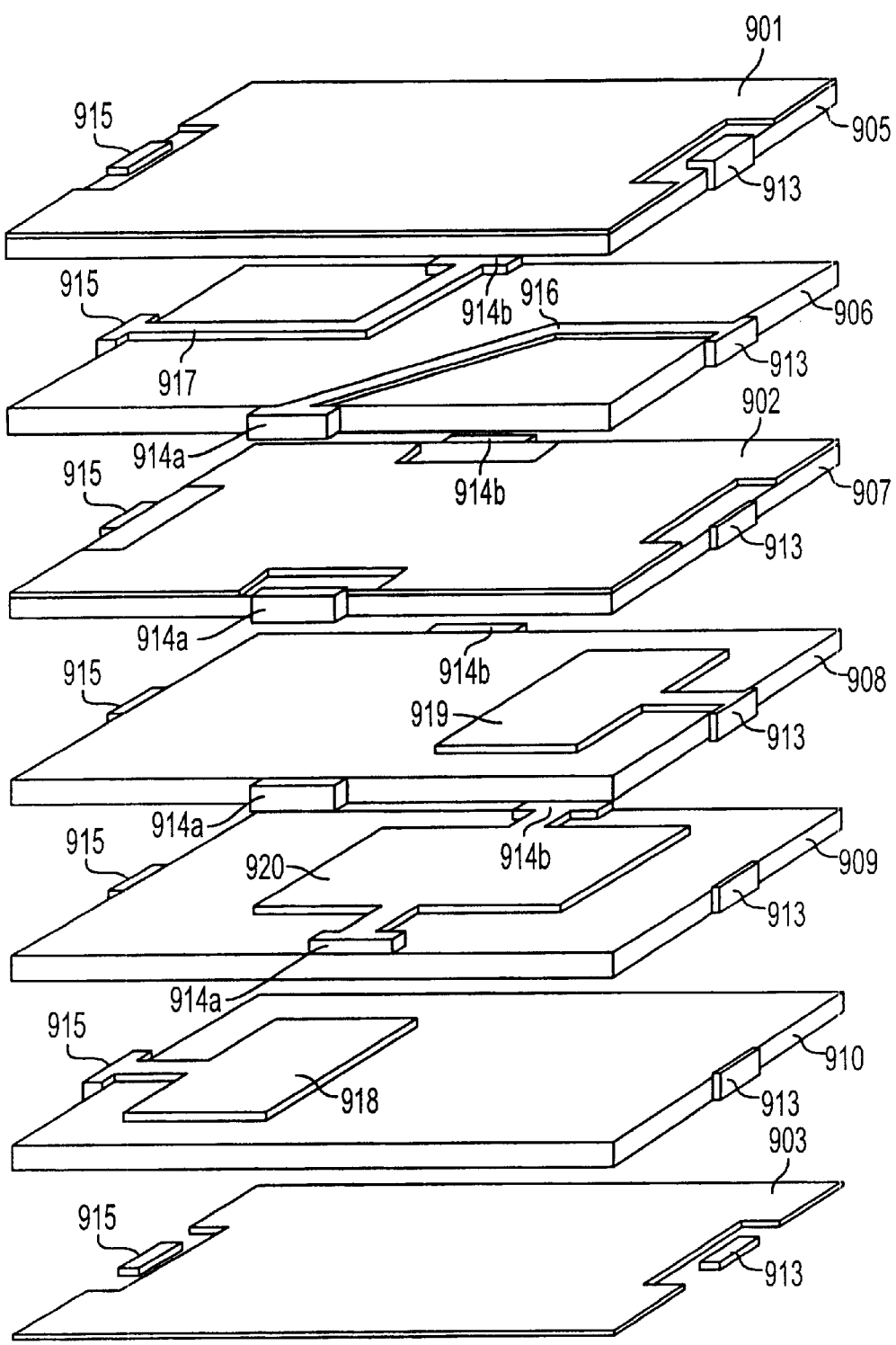

In FIG. 29, the π-type capacitor network between 601, 602, 604, 605 of FIG. 23(*b*) is implemented by conductor plates 918, 920. The π-type capacitor network between 602, 603, 605, 606 of FIG. 23(*b*) is implemented by conductor plates 920, 919. The inductor between 604 and 605 is implemented by a section of stripline 917. The inductor between 605 and 606 is implemented by stripline 916. The connections 604, 605, 606 are achieved by side electrodes 913, 914, 915. The side electrodes 913, 915 are also used as I/O pads. The implementation of connection 605 is achieved by side electrodes 914*a* and 914*b*, with 914*a* being used to connect stripline inductor 916 and 914*b* being used to connect stripline inductor 917. 901, 902, 903 are ground planes. 902 is used as a shielding layer. 905, 906, 907, 908, 909 and 910 are dielectric substrates or ceramic bodies.

FIGS. 27–29 are similar to one another except with regard to the conductor plates as explained below. In FIG. 27, the three conductor plates 718, 719, 720 are disposed on separate substrate layers 708, 709, 710, respectively, with the intermediate conductor plate 720 being disposed on outer substrate layer 710. In FIG. 28, conductor plates 818, 819 are disposed on the same substrate layer 808, while the intermediate conductor plate 820 is disposed on a different substrate layer 809. In FIG. 29, the three conductor plates 918, 919, 920 are disposed on different substrate layers 910, 908, 909, respectively, with the intermediate conductor plate 920 being disposed on substrate layer 909 disposed between the other two plates 918 and 919. The selection among the alternative arrangements of the conductor plates depends on the required capacitor values and the thickness arrangement of the substrates in the integration of the circuit module. In general, larger required capacitor values require smaller layer thicknesses between conductor plates, when the sizes of the conductor plates must be minimized. Also, the arrangement of FIG. 29 can prevent direct coupling between conductor plates 918 and 919. If the capacitive coupling between plate 318 (415, 718, 818) and 319 (416, 719, 819) is too large, the circuit performance might be degraded. The coupling between these plates is not taken into account in the circuit model according to the present invention.

Figure 30:
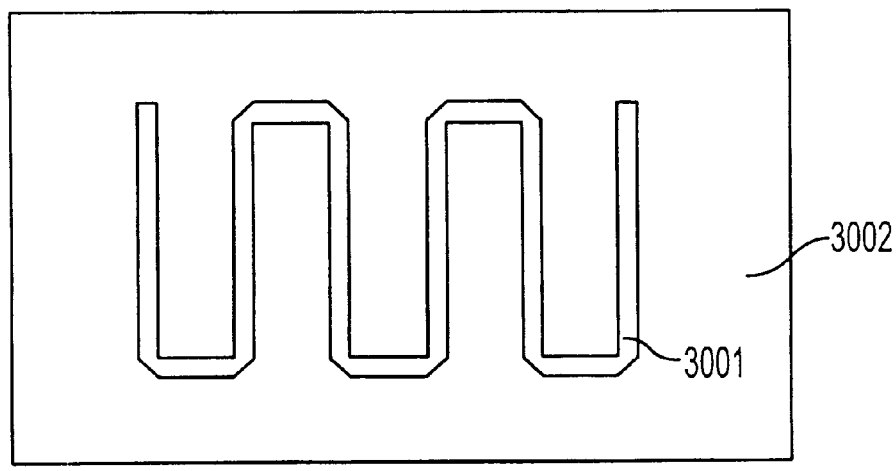
FIG. 30 shows a conductive strip of the FIG. 8 circuit in a meandered configuration.

FIG. 30 shows a stripline 3001 formed on dielectric substrate 3002 in a meandered configuration. Any of the conductive strips of the FIG. 8 circuit or the striplines of the embodiments of FIGS. 24–29 may have this shape.

Figure 31:
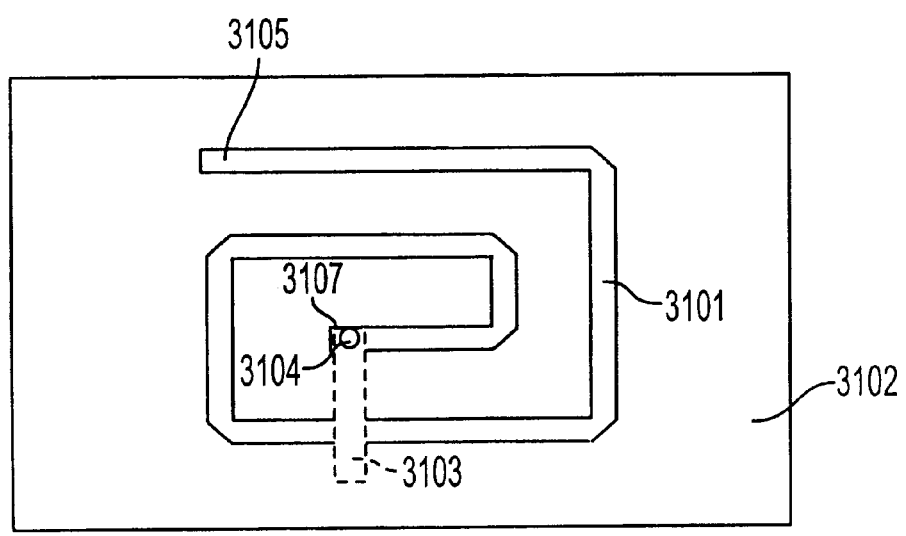
FIG. 31 illustrates a conductive strip of the FIG. 8 circuit, in a spiral configuration.

FIG. 31 shows a stripline 3101 in a spiral configuration. Any of the conductive strips of the FIG. 8 circuit or the striplines of the embodiments of FIGS. 24–29 may have this spiral configuration. In FIG. 31, stripline 3101 is formed on dielectric substrate 3102 and has a first end 3105 and a second end 3107 connected through a via 3104 to a conductor strip 3103 located at a different layer than stripline 3101.

Although the present invention has been fully described by way of examples with reference to the accompanying drawings, it should be understood that numerous variations, modifications and substitutions, as well as rearrangements and combinations, of the preceding embodiments will be apparent to those skilled in the art without departing from the novel spirit and scope of this invention.

What is claimed is:

1. A laminated lowpass filter circuit comprising:
    (a) a first dielectric substrate layer having substantially planar opposing surfaces;
    (b) a first groundplane conductor layer disposed on a first one of said opposing surfaces;
    (c) a first conductor plate comprising a capacitive element disposed on a second one of said opposing surfaces and having a terminal;
    (d) a second dielectric substrate layer having substantially planar opposing surfaces with a first one of said opposing surfaces of said second dielectric substrate layer being disposed over said first conductor plate;
    (e) a second conductor plate comprising a capacitive element disposed on a second one of said opposing surfaces of said second dielectric substrate layer and having a terminal;
    (f) a third dielectric substrate layer having substantially planar opposing surfaces, with a first one of said opposing surfaces of said third dielectric substrate layer being disposed over said second conductor plate;
    (g) a shielding conductor layer disposed over a second one of said opposing surfaces of said third dielectric substrate layer;
    (h) a fourth dielectric substrate layer having substantially planar opposing surfaces, with a first one of said opposing surfaces of said fourth dielectric substrate layer being disposed over said shielding conductor layer;
    (i) a stripline comprising an inductive element disposed on a second one of said opposing surfaces of said fourth dielectric substrate layer and having a first end and a second end;
    (j) a fifth dielectric substrate layer having substantially planar opposing surfaces, with a first one of said opposing surfaces of said fifth dielectric substrate layer being disposed over said stripline;
    (k) a second groundplane conductor layer disposed over a second one of said opposing surfaces of said fifth dielectric substrate layer, said first through fifth dielectric substrates, said first and second groundplane conductor layers and said shielding conductor layer being arranged in a stack; and
    (l) a first side electrode formed on a first side of said stack and a second side electrode formed on a second side of said stack, said terminal of said first conductor plate and said first end of said stripline being connected to said first side electrode, and said terminal of said second conductor plate and said second end of said stripline being connected to said second side electrode, and said first and second side electrodes constituting input and output terminals of said laminated lowpass filter circuit.

2. A laminated lowpass filter circuit according to claim 1, wherein said stripline is in one of a meandered configuration and a spiral configuration.

3. A laminated lowpass filter circuit comprising:
    (a) a first dielectric substrate layer having substantially planar opposing surfaces;
    (b) a first groundplane conductor layer disposed on a first one of said opposing surfaces;
    (c) a first stripline comprising an inductive element disposed on a second one of said opposing surfaces of said first dielectric substrate layer and having a first end and a second end;
    (d) a second dielectric substrate layer having substantially planar opposing surfaces with a first one of said opposing surfaces of said second dielectric substrate layer being disposed over said first stripline;
    (e) a first shielding conductor layer disposed over a second one of said opposing surfaces of said second dielectric substrate layer;
    (f) a third dielectric substrate layer having substantially planar opposing surfaces with a first one of said opposing surfaces of said third dielectric substrate layer being disposed over said first shielding conductor layer;
    (g) a first conductor plate comprising a capacitive element disposed on a second one of said opposing surfaces of said third dielectric layer and having a terminal;
    (h) a fourth dielectric substrate layer having substantially planar opposing surfaces with a first one of said opposing surfaces of said fourth dielectric substrate layer being disposed over said first conductor plate;
    (i) a second conductor plate comprising a capacitive element disposed on a second one of said opposing surfaces of said fourth dielectric substrate layer and having a terminal;

(j) a fifth dielectric substrate layer having substantially planar opposing surfaces, with a first one of said opposing surfaces of said fifth dielectric substrate layer being disposed over said second conductor plate;

(k) a third conductor plate comprising a capacitive element disposed on a second one of said opposing surfaces of said fifth dielectric substrate layer and having a terminal;

(l) a sixth dielectric substrate layer having substantially planar opposing surfaces, with a first one of said opposing surfaces of said sixth dielectric substrate layer being disposed over said third conductor layer;

(m) a second shielding conductor layer disposed over a second one of said opposing surfaces of said sixth dielectric substrate layer;

(n) a seventh dielectric substrate layer having substantially planar opposing surfaces, with a first one of said opposing surfaces of said seventh dielectric substrate layer being disposed over said shielding conductor layer;

(o) a second stripline comprising an inductive element disposed on a second one of said opposing surfaces of said seventh dielectric substrate layer and having a first end and a second end;

(p) an eighth dielectric substrate layer having substantially planar opposing surfaces, with a first one of said opposing surfaces of said eighth dielectric substrate layer being disposed over said second stripline;

(q) a second groundplane conductor layer disposed over a second one of said opposing surfaces of said eighth dielectric substrate layer, said first through eighth dielectric substrates, said first and second groundplane conductor layers and said first and second shielding conductor layers being arranged in a stack; and (r) a first side electrode formed on a first side of said stack, a second side electrode formed on a second side of said stack, and a third side electrode formed on a third side of said stack, said terminal of said second conductor plate and said first end of said second stripline being connected to said first side electrode, said second terminal of said first stripline and said terminal of said third conductor layer being connected to said second side electrode, said first terminal of said first stripline, said terminal of said second conductor plate, and said second end of said second stripline being connected to said third side electrode, and said first and second side electrodes constituting input and output terminals of said laminated lowpass filter circuit.

4. A laminated lowpass filter circuit according to claim 3 wherein said first and second striplines are in one of a meandered configuration and a spiral configuration.

5. A laminated lowpass filter circuit comprising:

(a) a first dielectric substrate layer having substantially planar opposing surfaces;

(b) a first groundplane conductor layer disposed on a first one of said opposing surfaces;

(c) a first conductor plate comprising a capacitive element disposed on a second one of said opposing surfaces and having a terminal;

(d) a second dielectric substrate layer having substantially planar opposing surfaces with a first one of said opposing surfaces of said second dielectric substrate layer being disposed over said first conductor plate;

(e) a second conductor plate comprising a capacitive element disposed on a second one of said opposing surfaces of said second dielectric substrate layer and having a terminal;

(f) a third dielectric substrate layer having substantially planar opposing surfaces, with a first one of said opposing surfaces of said third dielectric substrate layer being disposed over said second conductor plate;

(g) a third conductor plate comprising a capacitive element disposed on a second one of said opposing surfaces of said third dielectric substrate layer and having a terminal;

(h) a fourth dielectric substrate layer having substantially planar opposing surfaces, with a first one of said opposing surfaces of said fourth dielectric substrate layer being disposed over said third conductor plate;

(i) a shielding conductor layer disposed over a second one of said opposing surfaces of said fourth dielectric substrate layer;

(h) a fifth dielectric substrate layer having substantially planar opposing surfaces, with a first one of said opposing surfaces of said fifth dielectric substrate layer being disposed over said shielding conductor layer;

(i) a stripline comprising an inductive element disposed on a second one of said opposing surfaces of said fifth dielectric substrate layer and having a first end, a second end and a middle portion;

(j) a sixth dielectric substrate layer having substantially planar opposing surfaces, with a first one of said opposing surfaces of said sixth dielectric substrate layer being disposed over said stripline;

(k) a second groundplane conductor layer disposed over a second one of said opposing surfaces of said sixth dielectric substrate layer, said first through sixth dielectric substrates, said first and second groundplane conductor layers and said shielding conductor layer being arranged in a stack; and (l) a first side electrode formed on a first side of said stack, a second side electrode formed on a second side of said stack, and a third side electrode formed on a third side of said stack, said terminal of said second conductor plate and said first end of said stripline being connected to said first side electrode, said terminal of said third conductor plate and said second end of said stripline being connected to said second side electrode, said terminal of said first conductor plate and said middle portion of said stripline being connected to said third side electrode, and said first and second side electrodes constituting input and output terminals of said laminated lowpass filter circuit.

6. A laminated lowpass filter circuit according to claim 5, wherein said stripline is in one of a meandered configuration and a spiral configuration.

7. A laminated lowpass filter circuit comprising:

(a) a first dielectric substrate layer having substantially planar opposing surfaces;

(b) a first groundplane conductor layer disposed on a first one of said opposing surfaces;

(c) a first conductor plate comprising a capacitive element disposed on a second one of said opposing surfaces and having first and second terminals;

(d) a second dielectric substrate layer having substantially planar opposing surfaces with a first one of said opposing surfaces of said second dielectric substrate layer being disposed over said first conductor plate;

(e) a second conductor plate comprising a capacitive element disposed on a second one of said opposing surfaces of said second dielectric substrate layer and having a terminal;

(f) a third dielectric substrate layer having substantially planar opposing surfaces, with a first one of said opposing surfaces of said third dielectric substrate layer being disposed over said second conductor plate;

(g) a third conductor plate comprising a capacitive element disposed on a second one of said opposing surfaces of said third dielectric substrate layer and having a terminal;

(h) a fourth dielectric substrate layer having substantially planar opposing surfaces, with a first one of said opposing surfaces of said fourth dielectric substrate layer being disposed over said third conductor plate;

(i) a shielding conductor layer disposed over a second one of said opposing surfaces of said fourth dielectric substrate layer;

(j) a fifth dielectric substrate layer having substantially planar opposing surfaces, with a first one of said opposing surfaces of said fifth dielectric substrate layer being disposed over said shielding conductor layer;

(k) a first stripline comprising an inductive element disposed on a second one of said opposing surfaces of said fifth dielectric substrate layer and having a first end and a second end;

(l) a second stripline comprising an inductive element disposed on said second one of said opposing surfaces of said fifth dielectric substrate layer and having a first end and a second end;

(m) a sixth dielectric substrate layer having substantially planar opposing surfaces, with a first one of said opposing surfaces of said sixth dielectric substrate layer being disposed over said first and second striplines;

(n) a second groundplane conductor layer disposed over a second one of said opposing surfaces of said sixth dielectric substrate layer, said first through sixth dielectric substrates, said first and second groundplane conductor layers and said shielding conductor layer being arranged in a stack; and (o) a first side electrode formed on a first side of said stack, a second side electrode formed on a second side of said stack, a third side electrode formed on a third side of said stack, and a fourth side electrode formed on a fourth side of said stack, said terminal of said second conductor plate and said first end of said first stripline being connected to said first side electrode, said terminal of said third conductor plate and said second end of said second stripline being connected to said second side electrode, said first terminal of said first conductor plate and said second end of said first stripline being connected to said third side electrode, said second terminal of said first conductor plate and said first end of said second stripline being connected to said fourth side electrode, and said first and second side electrodes constituting input and output terminals of said laminated lowpass filter circuit.

8. A laminated lowpass filter circuit according to claim 7, wherein said first and second striplines are in one of a meandered configuration and a spiral configuration.

9. A laminated lowpass filter circuit comprising:

(a) a first dielectric substrate layer having substantially planar opposing surfaces;

(b) a first groundplane conductor layer disposed on a first one of said opposing surfaces;

(c) a first conductor plate comprising a capacitive element disposed on a second one of said opposing surfaces and having first and second terminals;

(d) a second dielectric substrate layer having substantially planar opposing surfaces with a first one of said opposing surfaces of said second dielectric substrate layer being disposed over said first conductor plate;

(e) a second conductor plate comprising a capacitive element disposed on a second one of said opposing surfaces of said second dielectric substrate layer and having a terminal;

(f) a third conductor plate comprising a capacitive element disposed on said second one of said opposing surfaces of said second dielectric substrate layer and having a terminal;

(g) a third dielectric substrate layer having substantially planar opposing surfaces, with a first one of said opposing surfaces of said third dielectric substrate layer being disposed over said second and third conductor plates;

(h) a shielding conductor layer disposed over a second one of said opposing surfaces of said third dielectric substrate layer;

(i) a fourth dielectric substrate layer having substantially planar opposing surfaces, with a first one of said opposing surfaces of said fourth dielectric substrate layer being disposed over said shielding conductor layer;

(j) a first stripline comprising an inductive element disposed on a second one of said opposing surfaces of said fourth dielectric substrate layer and having a first end and a second end;

(k) a second stripline comprising an inductive element disposed on said second one of said opposing surfaces of said fourth dielectric substrate layer and having a first end and a second end;

(l) a fifth dielectric substrate layer having substantially planar opposing surfaces, with a first one of said opposing surfaces of said fifth dielectric substrate layer being disposed over said first and second striplines;

(m) a second groundplane conductor layer disposed over a second one of said opposing surfaces of said fifth dielectric substrate layer, said first through fifth dielectric substrates, said first and second groundplane conductor layers and said shielding conductor layer being arranged in a stack; and (n) a first side electrode formed on a first side of said stack, a second side electrode formed on a second side of said stack, a third side electrode formed on a third side of said stack, and a fourth side electrode formed on a fourth side of said stack, said terminal of said second conductor plate and said first end of said first stripline being connected to said first side electrode, said terminal of said third conductor plate and said second end of said second stripline being connected to said second side electrode, said first terminal of said first conductor plate and said second end of said first stripline being connected to said third side electrode, said second terminal of said first conductor plate and a first end of said second stripline being connected to said fourth side electrode, and said first and second side electrodes constituting input and output terminals of said laminated lowpass filter circuit.

10. A laminated lowpass filter circuit according to claim 9, wherein said first and second striplines are in one of a meandered configuration and a spiral configuration.

11. A laminated lowpass filter circuit comprising:

(a) a first dielectric substrate layer having substantially planar opposing surfaces;

(b) a first groundplane conductor layer disposed on a first one of said opposing surfaces;

(c) a first conductor plate comprising a capacitive element disposed on a second one of said opposing surfaces and having a terminal;

(d) a second dielectric substrate layer having substantially planar opposing surfaces with a first one of said opposing surfaces of said second dielectric substrate layer being disposed over said first conductor plate;

(e) a second conductor plate comprising a capacitive element disposed on a second one of said opposing surfaces of said second dielectric substrate layer and having first and second terminals;

(f) a third dielectric substrate layer having substantially planar opposing surfaces, with a first one of said opposing surfaces of said third dielectric substrate layer being disposed over said second conductor plate;

(g) a third conductor plate comprising a capacitive element disposed on a second one of said opposing surfaces of said third dielectric substrate layer and having a terminal;

(h) a fourth dielectric substrate layer having substantially planar opposing surfaces, with a first one of said opposing surfaces of said fourth dielectric substrate layer being disposed over said third conductor plate;

(i) a shielding conductor layer disposed over a second one of said opposing surfaces of said fourth dielectric substrate layer;

(j) a fifth dielectric substrate layer having substantially planar opposing surfaces, with a first one of said opposing surfaces of said fifth dielectric substrate layer being disposed over said shielding conductor layer;

(k) a first stripline comprising an inductive element disposed on a second one of said opposing surfaces of said fifth dielectric substrate layer and having a first end and a second end;

(l) a second stripline comprising an inductive element disposed on said second one of said opposing surfaces of said fifth dielectric substrate layer and having a first end and a second end;

(m) a sixth dielectric substrate layer having substantially planar opposing surfaces, with a first one of said opposing surfaces of said sixth dielectric substrate layer being disposed over said first and second striplines;

(n) a second groundplane conductor layer disposed over a second one of said opposing surfaces of said sixth dielectric substrate layer, said first through sixth dielectric substrates, said first and second groundplane conductor layers and said shielding conductor layer being arranged in a stack; and (o) a first side electrode formed on a first side of said stack, a second side electrode formed on a second side of said stack, a third side electrode formed on a third side of said stack, and a fourth side electrode formed on a fourth side of said stack, said terminal of said third conductor plate and said first end of said first stripline being connected to said first side electrode, said terminal of said first conductor plate and said second end of said second stripline being connected to said second side electrode, said first terminal of said second conductor plate and said second end of said first stripline being connected to said third side electrode, said second terminal of said second conductor plate and said first end of said second stripline being connected to said fourth side electrode, and said first and second side electrodes constituting input and output terminals of said laminated lowpass filter circuit.

12. A laminated lowpass filter circuit according to claim 11, wherein said first and second striplines are in one of a meandered configuration and a spiral configuration.

* * * * *